US011224986B2

(12) United States Patent
Terada

(10) Patent No.: US 11,224,986 B2
(45) Date of Patent: Jan. 18, 2022

(54) CUTTING APPARATUS AND METHOD OF CHANGING CONSUMABLE PARTS

(71) Applicant: DISCO CORPORATION, Tokyo (JP)

(72) Inventor: Kazuki Terada, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/896,507

(22) Filed: Jun. 9, 2020

(65) Prior Publication Data
US 2020/0398452 A1    Dec. 24, 2020

(30) Foreign Application Priority Data

Jun. 18, 2019  (JP) .............................. JP2019-113238

(51) Int. Cl.
*B26D 7/26* (2006.01)
*B26D 1/15* (2006.01)

(52) U.S. Cl.
CPC .............. *B26D 7/2621* (2013.01); *B26D 1/15* (2013.01)

(58) Field of Classification Search
CPC ............ Y10T 83/8727; Y10T 83/8732; B26D 7/2621; B26D 7/26; B26D 7/2614; B26D 1/15; B26D 1/12; B26D 1/14; B26D 1/143; B24B 27/00; B24B 27/06; B23Q 3/155; B23Q 3/15513; B23Q 3/1552; B23Q 3/15526; B23Q 3/1554; B23Q 2003/15541; B23Q 2003/155414; B23Q 2003/155418; B23Q 2003/155425; B23Q 2003/155428
See application file for complete search history.

(56) References Cited

U.S. PATENT DOCUMENTS

| 5,188,579 | A | * | 2/1993 | Ruschle | ............... | B23Q 3/1554 483/1 |
| 6,030,326 | A |   | 2/2000 | Azuma et al. | | |
| 8,523,500 | B2 | * | 9/2013 | Yamaura | ............... | B23Q 1/623 409/211 |

(Continued)

FOREIGN PATENT DOCUMENTS

JP    2007208114 A    8/2007

OTHER PUBLICATIONS

Search report issued in counterpart Singapore patent application No. 10202005164Y, dated Jun. 9, 2021.

*Primary Examiner* — Phong H Nguyen
(74) *Attorney, Agent, or Firm* — Greer, Burns & Crain, Ltd.

(57) ABSTRACT

A cutting apparatus includes a mount flange having a mount land that has a surface for holding a cutting blade as a consumable part, a changing apparatus for changing cutting blades, and a moving unit for moving the changing apparatus between a changing position for changing cutting blades and a retracted position. The changing apparatus includes a rotational shaft, a first holder for holding a used cutting blade, the first holder having a first holding surface facing in an outward direction from the rotational shaft perpendicularly to the rotational shaft, and a second holder for holding a replacement cutting blade, the second holder being disposed in a position angularly spaced a predetermined angle from the first holder around the rotational shaft, the second holder having a second holding surface facing in an outward direction from the rotational shaft perpendicularly to the rotational shaft.

14 Claims, 25 Drawing Sheets

(56) References Cited

U.S. PATENT DOCUMENTS

| | | | |
|---|---|---|---|
| 2009/0126542 A1* | 5/2009 | Nonaka | B26D 1/1535 83/43 |
| 2013/0095988 A1* | 4/2013 | Mayr | B23Q 5/40 483/49 |
| 2015/0020667 A1* | 1/2015 | Wakita | B27B 5/30 83/401 |
| 2016/0193706 A1* | 7/2016 | Kanda | B23Q 3/1554 483/58 |
| 2019/0219983 A1* | 7/2019 | Kashihara | G05B 19/409 |
| 2020/0130120 A1* | 4/2020 | Natsuda | B23Q 3/1554 |
| 2020/0238559 A1* | 7/2020 | Terada | B27B 5/32 |

* cited by examiner

CUTTING APPARATUS AND METHOD OF CHANGING CONSUMABLE PARTS

BACKGROUND OF THE INVENTION

Field of the Invention

The present invention relates to a cutting apparatus and a method of changing consumable parts.

Description of the Related Art

Cutting apparatuses having a cutting blade are used as processing apparatuses for cutting workpieces such as semiconductor wafers (see, for example, JP 2007-208114A). JP 2007-208114A proposes a cutting apparatus including a blade changing apparatus for automatically changing cutting blades in order to reduce man-hours required to change cutting blades as consumable parts.

The blade changing apparatus of the cutting apparatus disclosed in JP 2007-208114A has a plurality of blade holders disposed on a circle around the central axis of a shaft, for holding new and old blades respectively thereon. The blade holders are mounted on a blade support plate disposed on a distal end of the shaft and extending perpendicularly to the shaft. The blade support plate is positioned to make the central axis of the shaft parallel to the central axis of a spindle for changing cutting blades thereon.

SUMMARY OF THE INVENTION

However, since the blade changing apparatus of the cutting apparatus disclosed in JP 2007-208114A has the blade holders disposed on the circle around the central axis of the shaft, the blade changing apparatus takes up a large space for changing cutting blades as consumable parts. There have been demands for smaller blade changing apparatuses.

It is therefore an object of the present invention to provide a cutting apparatus and a method of changing consumable parts that can reduce a space for changing consumable parts.

In accordance with an aspect of the present invention, there is provided a cutting apparatus including a consumable part holding unit having a holding surface for holding a consumable part, a changing apparatus for changing the consumable part, and a moving unit for moving the changing apparatus between a changing position for changing the consumable part and a retracted position. The changing apparatus includes a rotational shaft, a first holder for holding a used consumable part, the first holder having a first holding surface facing in an outward direction from the rotational shaft perpendicularly to the rotational shaft, and a second holder for holding a replacement consumable part, the second holder being disposed in a position angularly spaced a predetermined angle from the first holder around the rotational shaft, the second holder having a second holding surface facing in an outward direction from the rotational shaft perpendicularly to the rotational shaft.

In the cutting apparatus, the changing apparatus may further include a third holder having a third holding surface facing in an outward direction from the rotational shaft perpendicularly to the rotational shaft and a fourth holder having a fourth holding surface facing in an outward direction from the rotational shaft perpendicularly to the rotational shaft. The first holder, the second holder, the third holder, and the fourth holder may be disposed in respective positions spaced at angular intervals of 90 degrees around the rotational shaft.

In the cutting apparatus, the first holding surface of the first holder may be tiltably coupled to the rotational shaft by a joint assembly having a resilient member, and the second holding surface of the second holder may be tiltably coupled to the rotational shaft by a joint assembly having a resilient member.

The cutting apparatus may further include a processing chamber for cutting a workpiece with a cutting unit therein. The changing apparatus may be disposed outside of the processing chamber, and the processing chamber may have an exit/entrance port defined therein for allowing the changing apparatus to move therethrough into and out of the processing chamber.

The cutting apparatus may further include a consumable part housing container for housing a consumable part transport jig therein, the consumable part housing container having a plurality of rest surfaces for holding a plurality of consumable parts placed thereon and a held portion outside of the rest surfaces, the held portion is to be held by a transport unit, a temporary rest for temporarily placing the consumable part transport jig thereon upon changing consumable parts, the transport unit for transporting the consumable part transport jig from the consumable part housing container to the temporary rest, and an image capturing unit for capturing an image of consumable parts placed on the consumable part transport jig, the image capturing unit being disposed in a transport route along which the transport unit transports consumable part transport jig.

The cutting apparatus may further include a cutting unit having a spindle and a cutting blade mounted on a distal end of the spindle by a mount flange. The consumable part may include the cutting blade, and the consumable part holding unit may include the mount flange.

The cutting apparatus may further include a holding table for holding a workpiece and a dressing board table for holding a dressing board, the dressing board table being disposed adjacent to the holding table. The consumable part may include the dressing board, and the consumable part holding unit may include the dressing board table.

In accordance with another aspect of the present invention, there is provided a changing method for changing consumable parts in the cutting apparatus described above. The changing method includes the steps of placing a replacement consumable part on a rest surface of a consumable part transport jig that has a plurality of rest surfaces for holding a plurality of consumable parts placed respectively thereon, holding the replacement consumable part placed on the rest surface of the consumable part transport jig, on the second holder, positioning the rotational shaft of the changing apparatus parallel to the holding surface of the consumable part holding unit to bring the first holding surface into facing relation to a used consumable part, positioning the first holder in a changing position for abutting against the used consumable part, and holding the used consumable part on the first holder, retracting the first holder that has held the used consumable part from the changing position to a retracted position, and rotating the rotational shaft to bring the second holding surface that has held the replacement consumable part into facing relation to the holding surface of the consumable part holding unit, positioning the second holder in the changing position, and holding the replacement consumable part on the holding surface of the consumable part holding unit.

In the changing method, the consumable part may include a cutting blade, and the consumable part holding unit may include a mount flange.

In the changing method, the consumable part may include a dressing board, and the consumable part holding unit may include a dressing board table.

According to the aspect and the other aspect described above, the cutting apparatus has a reduced space for changing consumable parts.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Modes for carrying out the present invention, i.e., embodiments of the present invention, will hereinafter be described in detail with reference to the drawings. The present invention is not limited to the details of the embodiment described below. The components described below cover those which could easily be anticipated by those skilled in the art and those which are essentially identical thereto. Furthermore, the arrangements described below can be used in appropriate combinations. Various omissions, replacements, or changes of the arrangements may be made without departing from the scope of the present invention.

First Embodiment

Figure 1:
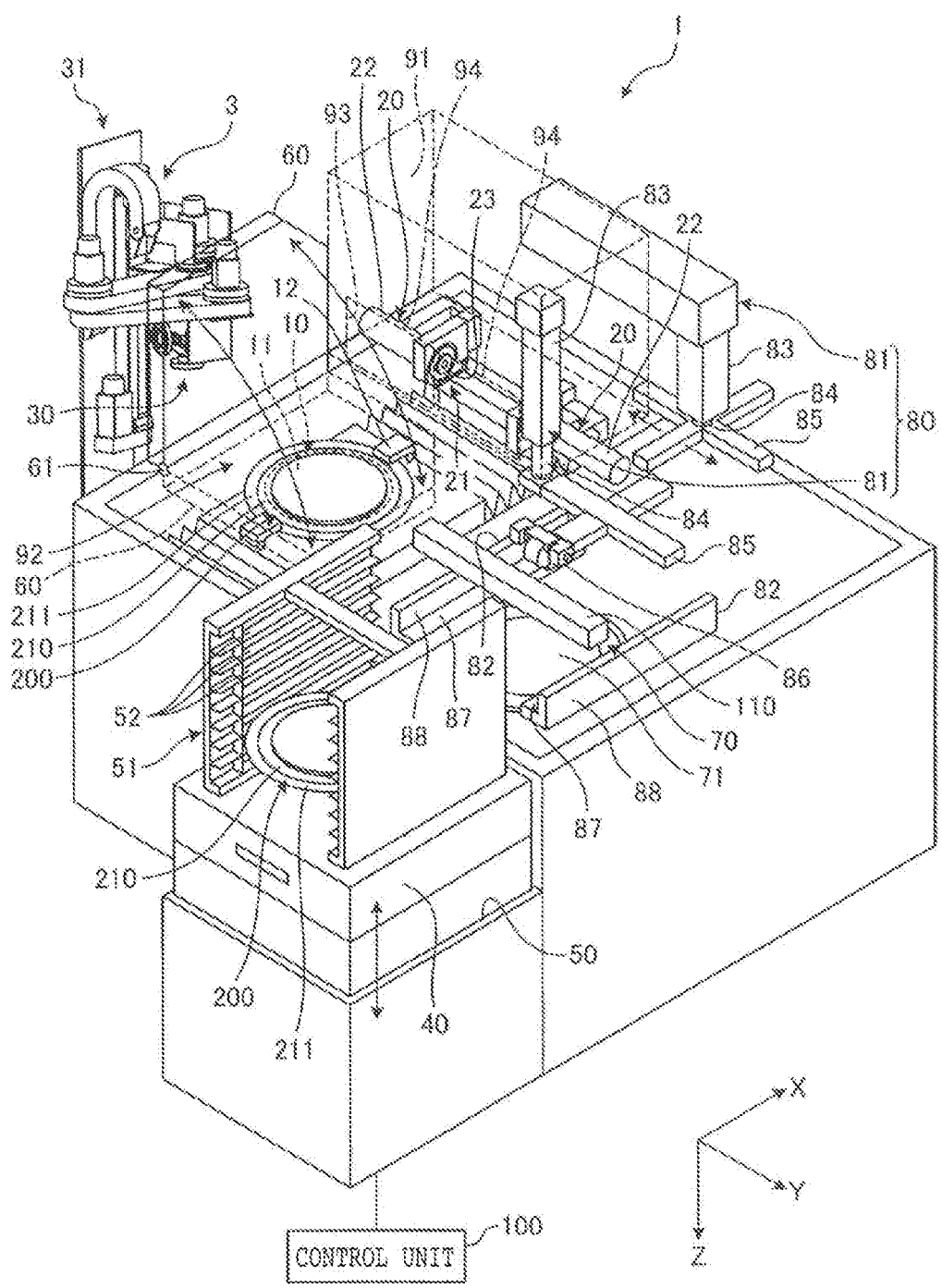
FIG. 1 is a perspective view illustrating a configuration example of a cutting apparatus according to a first embodiment of the present invention.
Figure 2:
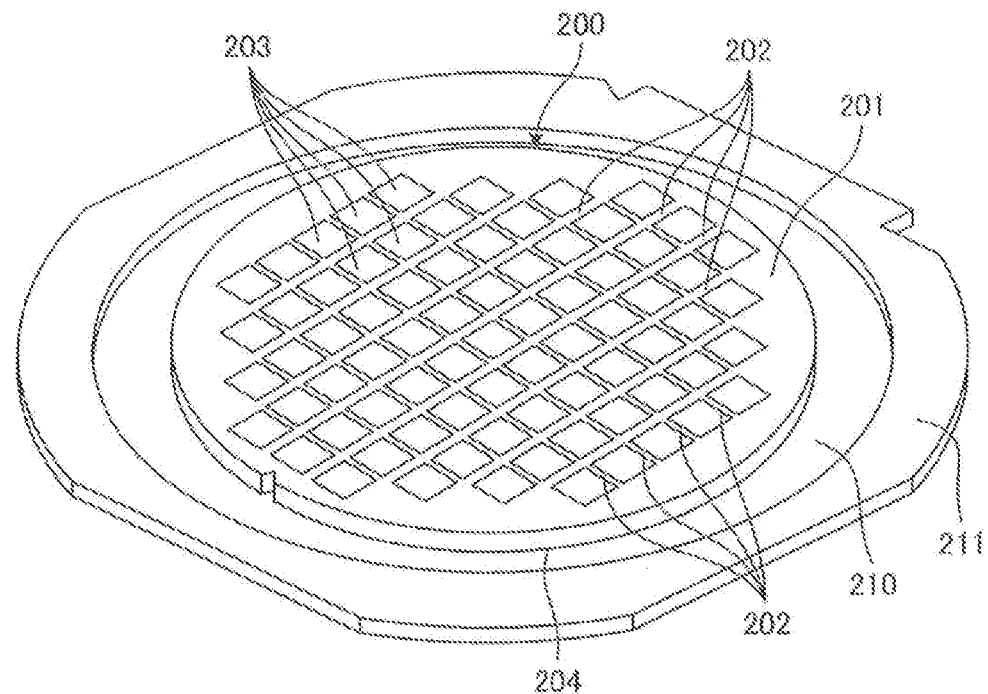
FIG. 2 is a perspective view of a workpiece as an object to be processed by the cutting apparatus illustrated in FIG. 1.
Figure 3:
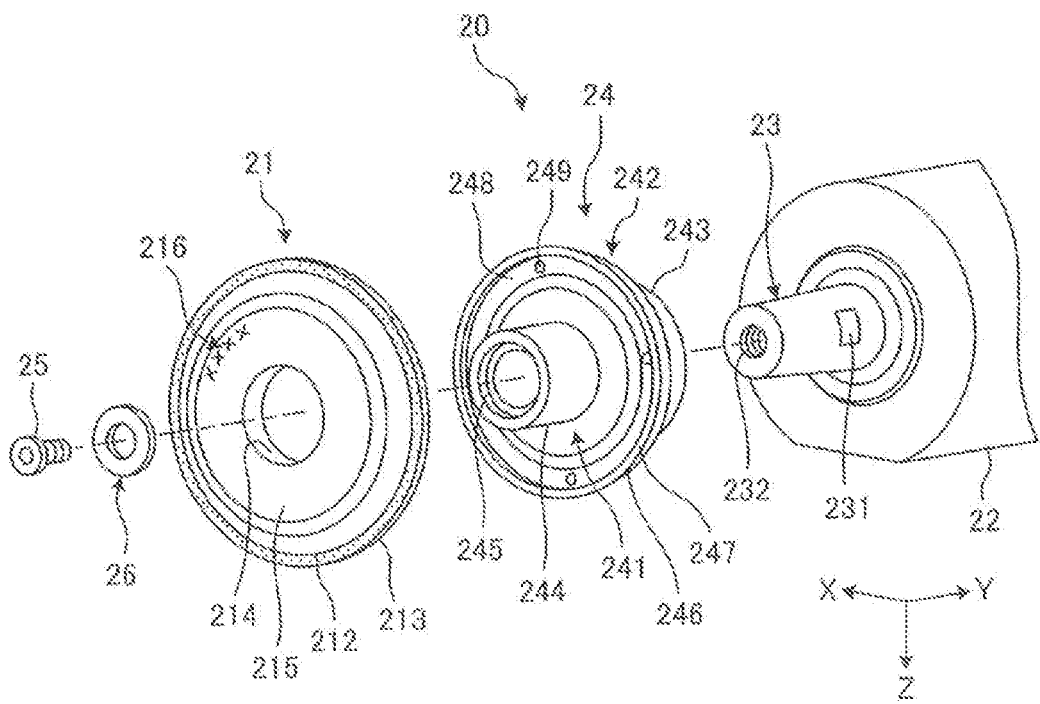
FIG. 3 is an exploded perspective view of a cutting unit of the cutting apparatus illustrated in FIG. 1.
Figure 4:
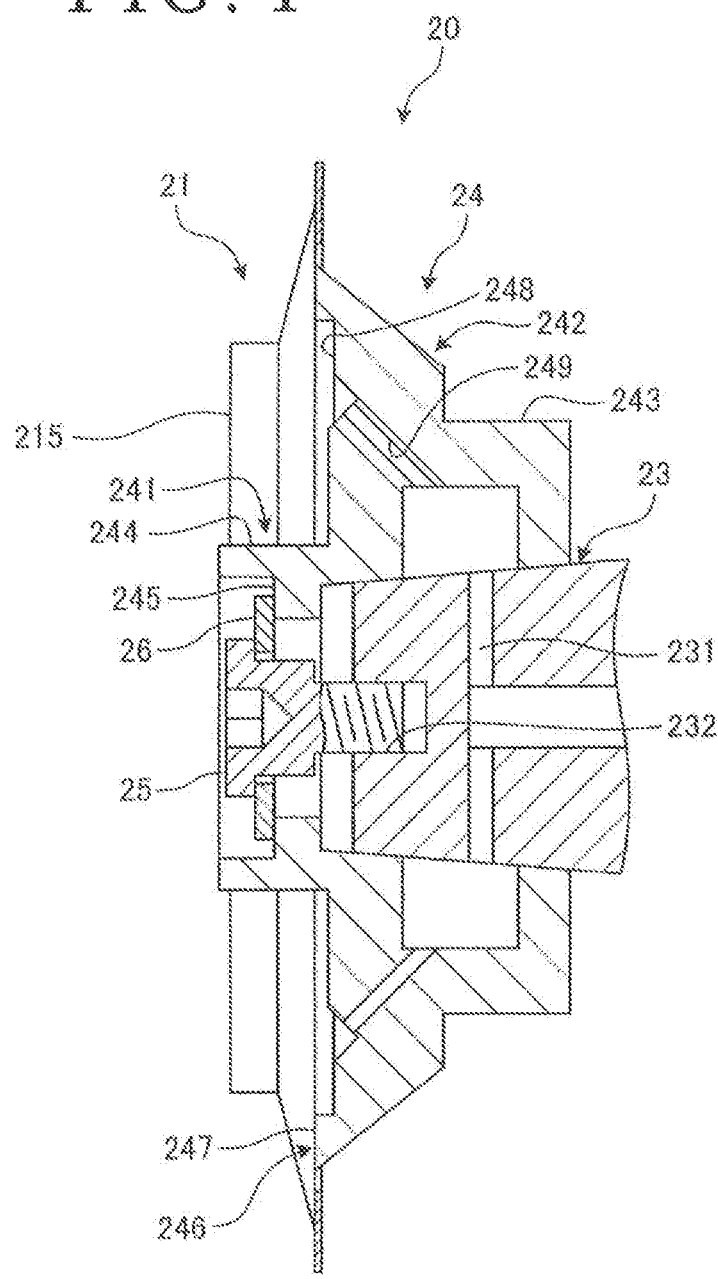
FIG. 4 is an enlarged cross-sectional view of a central portion of the cutting unit illustrated in FIG. 3.
Figure 5:
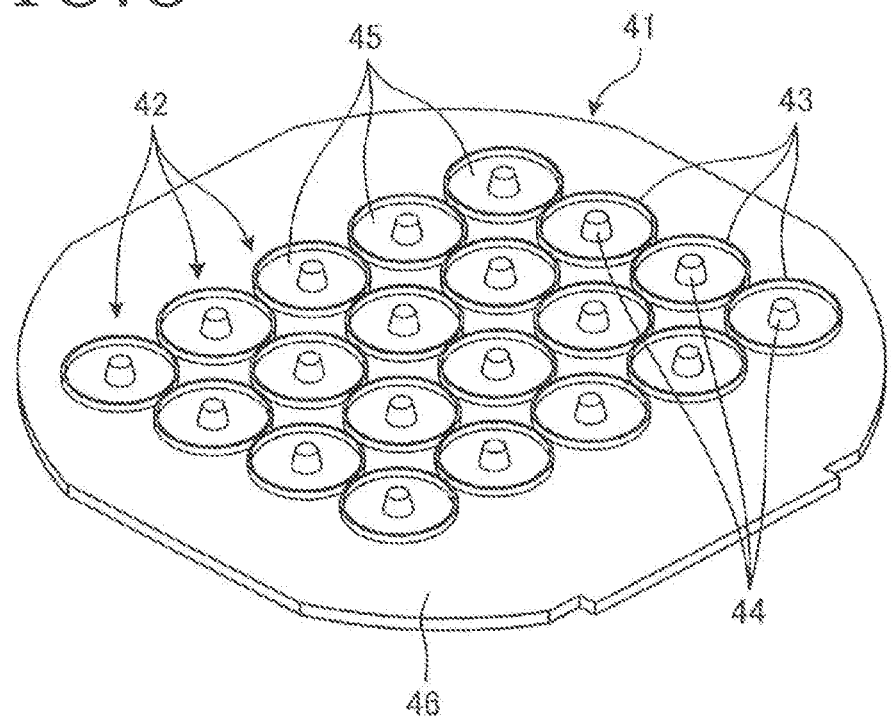
FIG. 5 is a perspective view illustrating a configuration example of a transport jig of the cutting apparatus illustrated in FIG. 1.
Figure 6:
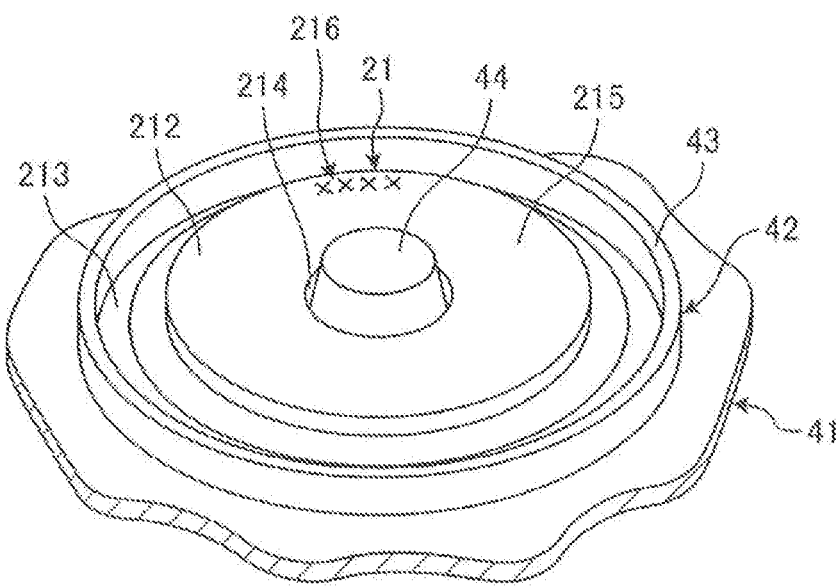
FIG. 6 is a perspective view illustrating a cutting blade placed on a blade rest of the transport jig illustrated in FIG. 5.

A cutting apparatus according to a first embodiment of the present invention will be described below with reference to the drawings. FIG. 1 is a perspective view illustrating a configuration example of the cutting apparatus according to the first embodiment. FIG. 2 is a perspective view of a workpiece as an object to be processed by the cutting apparatus illustrated in FIG. 1. FIG. 3 is an exploded perspective view of a cutting unit of the cutting apparatus illustrated in FIG. 1. FIG. 4 is an enlarged cross-sectional view of a central portion of the cutting unit illustrated in FIG. 3. FIG. 5 is a perspective view illustrating a configuration example of a transport jig of the cutting apparatus illustrated in FIG. 1. FIG. 6 is a perspective view illustrating a cutting blade placed on a blade rest of the transport jig illustrated in FIG. 5.

(Cutting Apparatus)

A cutting apparatus, denoted by 1, according to the first embodiment is an apparatus for cutting, i.e., processing, a workpiece 200 illustrated in FIG. 2. According to the first embodiment, the workpiece 200 is a wafer such as a disk-shaped semiconductor wafer or an optical device wafer made of a base material such as silicon, sapphire, or gallium. The workpiece 200 has a plurality of devices 203 formed in respective areas demarcated in a grid pattern by a grid of projected dicing lines 202 on a face side 201 of the workpiece 200.

The workpiece 200 according to the present invention may alternatively be what is generally called a TAIKO (registered trademark) wafer having a thinner central portion and a thicker outer circumferential portion, or, instead of a wafer, a rectangular packaged substrate having a plurality of devices encapsulated by a resin, a ceramics substrate, a ferrite substrate, a glass substrate, a substrate containing at least one of nickel and iron, or the like. According to the first embodiment, the workpiece 200 has a reverse side 204 affixed to an adhesive tape 210 including an outer circumferential edge on which an annular frame 211 is mounted, so that the workpiece 200 is supported on the annular frame 211 by the adhesive tape 210.

The cutting apparatus 1 illustrated in FIG. 1 includes a holding table 10 for holding the workpiece 200 under suction on a holding surface 11 thereof, a cutting unit 20 for cutting the workpiece 200 held on the holding table 10 with a cutting blade 21 as a consumable part mounted on a spindle 23, an image capturing unit, not illustrated, for capturing an image of the workpiece 200 held on the holding table 10, a blade changing unit 3 for changing the cutting blade 21 on the cutting unit 20, and a control unit 100 for controlling components of the cutting apparatus 1. The cutting apparatus 1 cuts, i.e., processes, the workpiece 200 held on the holding table 10 with the cutting blade 21 along the projected dicing lines 202 on the workpiece 200.

Furthermore, as illustrated in FIG. 1, the cutting apparatus 1 includes at least an X-axis moving unit, not illustrated, for process-feeding the holding table 10 in X-axis directions parallel to horizontal directions, a Y-axis moving unit, not illustrated, for index-feeding the cutting unit 20 in Y-axis directions parallel to horizontal directions and perpendicular to the X-axis directions, and a Z-axis moving unit, not illustrated, for incise-feeding the cutting unit 20 in Z-axis directions parallel to vertical directions and perpendicular to both the X-axis directions and the Y-axis directions. The cutting apparatus 1 is a 2-spindle dicer, i.e., a cutting apparatus of the facing dual type, that has two cutting units 20, as illustrated in FIG. 1.

The holding table 10 is of a disk shape in which the holding surface 11 for holding the workpiece 200 thereon is made of porous ceramics. The holding table 10 is movable by the X-axis moving unit along the X-axis directions between a position in a processing chamber 91 below the cutting units 20 and a loading/unloading position 92, spaced from the position below the cutting units 20, where the workpiece 200 can be loaded in and out. The holding table 10 is movable about a central axis parallel to the Z-axis directions by a rotary actuator, not illustrated.

The holding table 10 is connected to an evacuating source, not illustrated, and holds the workpiece 200 under suction on the holding surface 11 by being drawn by suction forces from the evacuating source. According to the first embodiment, the holding table 10 attracts and holds the reverse side 204 of the workpiece 200 under suction with the adhesive tape 210 interposed therebetween. As illustrated in FIGS. 1 and 3, a plurality of clamps 12 for clamping the annular frame 211 in position are disposed around the holding table 10. In FIG. 1, the devices 203 on the face side 201 of the workpiece 200 are omitted from illustration.

The processing chamber 91 defines therein a space in which the workpiece 200 is cut by the cutting units 20. The processing chamber 91 is isolated from outside by a plurality of partition walls mounted on an apparatus base 2 (see FIG. 11, for example). The partition wall that is disposed between the processing chamber 91 and the loading/unloading position 92 has an exit/entrance port 93 defined therein for allowing a changing apparatus 30, to be described later, to move therethrough into and out of the processing chamber 91. The exit/entrance port 93 can be opened and closed by a pair of cutting area covers 94. The cutting area covers 94 are movable by cylinders, not illustrated, between a position in which they close the exit/entrance port 93 and a position in which they open the exit/entrance port 93. As described above, the cutting apparatus 1 includes the processing chamber 91 in which the workpiece 200 is cut by the cutting units 20.

As illustrated in FIG. 3, each of the cutting units 20 is cutting means with the cutting blade 21 detachably mounted for cutting the workpiece 200 held on the holding table 10 while a cutting fluid is being supplied to the cutting blade 21 and the workpiece 200. Each cutting unit 20 is movable with respect to the workpiece 200 held on the holding table 10, in the Y-axis directions by the Y-axis moving unit and also in the Z-axis directions by the Z-axis moving unit.

Each of the cutting units 20 is mounted on one of columns of a portal-shaped support frame, not illustrated, erected on the apparatus base 2, by the Y-axis moving unit and the Z-axis moving unit. Each cutting unit 20 is able to position its cutting blade 21 at a desired position on the holding surface 11 of the holding table 10 by means of the Y-axis moving unit and the Z-axis moving unit.

As illustrated in FIG. 3, each cutting unit 20 has a spindle housing 22 that is movable in the Y-axis directions by the Y-axis moving unit and in the Z-axis directions by the Z-axis moving unit, a spindle 23 supported in the spindle housing 22 for rotation about its own central axis and rotatable by an electric motor, not illustrated, a mount flange 24 mounted as a consumable part holding unit on a distal end portion of the spindle 23, and a cutting blade 21 mounted on the distal end of the spindle 23 with the mount flange 24 interposed therebetween.

According to the first embodiment, the distal end portion of the spindle 23 is of a frustoconical shape that is progressively smaller in diameter toward its distal end, and protrudes from the distal end of the spindle housing 22. The spindle 23 has a suction channel 231 defined therein and opening at an outer circumferential surface of the distal end portion thereof, the suction channel 231 being connected to an evacuating source, not illustrated. The spindle 23 also has an internally threaded hole 232 defined in a distal end face thereof for receiving the externally threaded shank of a bolt 25 threaded therein.

The mount flange 24 includes a hollow cylindrical boss 241 and a flange 242 disposed axially centrally on the boss 241. The boss 241 has an end portion 243 in which the distal end portion of the spindle 23 is inserted and another end portion 244 in which the bolt 25 is housed. The end portion 243 of the boss 241 has an inner circumferential surface that is progressively smaller in diameter toward the other end portion 244 so that the outer circumferential surface of the distal end portion of the spindle 23 can be held in intimate contact with the inner circumferential surface of the end portion 243 of the boss 241. The end portion 243 of the boss 241 is larger in outside diameter than the other end portion 244 thereof. The other end portion 244 of the boss 241 has an inner circumferential surface including a washer bearing surface 245 that bears a washer 26 through which the externally threaded shank of the bolt 25 extends.

The flange 242 is of an annular shape having a diameter larger than the outside diameter of the boss 241. The flange 242 has a mount land 246 extending fully circumferentially along an outer edge thereof and protruding axially toward the other end portion 244 side. The mount land 246 has an axial surface 247 acting as a holding surface for holding the cutting blade 21 thereon and lying perpendicularly to the central axis of the mount flange 24. The mount flange 24 thus has the surface 247 of the mount land 246.

The mount flange 24 is mounted on the distal end portion of the spindle 23, as illustrated in FIG. 4, with the distal end portion of the spindle 23 being housed in the end portion 243 of the boss 241 and with the externally threaded shank of the bolt 25 extending through the washer 26 borne by the washer bearing surface 245 and being threaded in the internally threaded hole 232 in the spindle 23. The mount flange 24 has a suction channel 249 defined therein that has an end open at the inner circumferential surface of the end portion 243 of the boss 241 and another end open at a surface 248 of the flange 242 that extends radially inwardly from the mount land 246. The suction channel 249 is held in fluid communication with the suction channel 231 in the spindle 23 when the mount flange 24 is mounted on the distal end portion of the spindle 23.

The cutting blade 21 is in the form of an ultrathin abrasive cutting wheel having a substantially ring shape. According to the first embodiment, the cutting blade 21 is what is generally called a hub blade including an annular support base 212 made of metal such as aluminum alloy and an annular cutting edge 213 fixed to the outer circumference of the support base 212 for cutting the workpiece 200. The support base 212 has a mount hole 214 defined centrally therein and is mounted on the boss 241 of the mount flange 24 that is inserted in the mount hole 214. The cutting edge 213 is made of abrasive grains of diamond, cubic boron nitride (CBN), or the like and a bonding material, i.e., a binder, of metal, resin, or the like. The cutting edge 213 has a predetermined axial thickness.

The mount hole 214 in the support base 212 of the cutting blade 21 is fitted over the outer circumference of the other end portion 244 of the boss 241 of the mount flange 24 mounted on the distal end portion of the spindle 23. At this time, the support base 212 is held in intimate contact with the surface 247 of the mount land 246. The cutting blade 21 is securely held on the mount flange 24 when the space between the surface 248 of the flange 242, the mount land 246 thereof, and the support base 212 is evacuated through the suction channels 231 and 249 by the evacuating source.

The spindle 23, the mount flange 24, and the cutting blade 21 on the cutting unit 20 have respective central axes parallel to the Y-axis directions.

According to the first embodiment, an identification mark 216 for identifying the type of the cutting blade 21 is applied to a surface 215 of the support base 212 that faces away from the mount flange 24 on which the cutting blade 21 is fixedly mounted. According to the present embodiment, the identification mark 216 indicates the thickness of the cutting edge 213, the distance by which the cutting edge 213 projects radially outwardly from the outer circumferential surface of the support base 212, and the particle diameter of the abrasive grains of the cutting edge 213.

The image capturing unit is fixed to the cutting unit 20 for movement in unison therewith. The image capturing unit includes an image capturing sensor for capturing an image of a region to be divided of the workpiece 200 held on the holding table 10 that is yet to be cut. The image capturing sensor may be a charge-coupled device (CCD) image sensor or a complementary metal-oxide semiconductor (CMOS) image sensor. The image capturing unit captures an image of the workpiece 200 held on the holding table 10 for use in an alignment process for positioning the workpiece 200 and the cutting blade 21 with respect to each other, and outputs the captured image to the control unit 100.

The X-axis moving unit moves the holding table 10 in the X-axis directions as process-feeding directions, thereby process-feeding the holding table 10 and the cutting unit 20 relatively to each other along the X-axis directions. The Y-axis moving unit moves the cutting unit 20 in the Y-axis directions as index-feeding directions, thereby index-feeding the holding table 10 and the cutting unit 20 relatively to each other along the Y-axis directions. The Z-axis moving unit moves the cutting unit 20 in the Z-axis directions as incise-feeding directions, thereby incise-feeding the holding table 10 and the cutting unit 20 relatively to each other along the Z-axis directions.

Each of the X-axis moving unit, the Y-axis moving unit, and the Z-axis moving unit includes a known ball screw rotatable about its own central axis, a known electric motor for rotating the ball screw about its own central axis, and known guide rails on which the holding table 10 or the cutting unit 20 are movably supported for movement in the X-axis directions, the Y-axis directions, or the Z-axis directions.

Furthermore, the cutting apparatus 1 includes an X-axis direction position detecting unit, not illustrated, for detecting the position of the holding table 10 in the X-axis directions, a Y-axis direction position detecting unit, not illustrated, for detecting the position of the cutting unit 20 in the Y-axis directions, and a Z-axis direction position detecting unit, not illustrated, for detecting the position of the cutting unit 20 in the Z-axis directions. Each of the X-axis direction position detecting unit and the Y-axis direction position detecting unit includes a linear scale parallel to the X-axis directions or the Y-axis directions and a reading head. The Z-axis direction position detecting unit detects the position of the cutting unit 20 in the Z-axis directions with pulses from an electric motor. The X-axis direction position detecting unit, the Y-axis direction position detecting unit, and the Z-axis direction position detecting unit output the positions of the holding table 10 in the X-axis directions, the cutting unit 20 in the Y-axis directions, and the cutting unit 20 in the Z-axis directions to the control unit 100.

As illustrated in FIG. 1, the cutting apparatus 1 includes a cassette elevator 50 on which a consumable part housing container 40 is placed, a table cover 60 as a temporary rest, a cleaning unit 70 for cleaning a workpiece 200 after it has been cut, a transport unit 80 as transport means, and a line scanner 110 as an image capturing unit. The consumable part housing container 40 is in the form of a box for housing a transport jig 41 as a consumable part transport jig illustrated in FIG. 5. The transport jig 41 can be taken into and out of the consumable part housing container 40 through an unillustrated opening defined in a wall thereof that faces the cleaning unit 70.

The transport jig 41 is a jig for transporting a cutting blade 21 from the consumable part housing container 40 onto the holding table 10 at the loading/unloading position 92 when the cutting blade 21 mounted on one of the cutting units 20 is to be replaced. The transport jig 41 is of a plate shape whose outer profile as viewed in plan is the same as the outer profile as viewed in plan of the annular frame 211, and is integrally formed of a hard material such as metal, for example.

As illustrated in FIGS. 5 and 6, the transport jig 41 includes a plurality of blade rests 42 for placing respective cutting blades 21 thereon. Each of the blade rests 42 holds one cutting blade 21 placed and positioned thereon. Each blade rest 42 includes a hollow cylindrical upstanding tube 43 erected from the surface of the transport jig 41 and a positioning post 44 erected from the surface of the transport jig 41 and positioned in the upstanding tube 43. The upstanding tube 43 has an inner circumferential surface whose shape as viewed in plan is the same as the shape of the outer edge of the cutting edge 213 of the cutting blade 21 as viewed in plan, and houses the cutting blade 21 therein.

According to the first embodiment, the upstanding tube 43 houses the cutting blade 21 with the cutting edge 213 thereof overlapping the surface of the transport jig 41. The blade rest 42 has a bottom surface 45 acting as a rest surface over which the cutting blade 21 can be placed. The positioning post 44 positions the cutting blade 21 in the upstanding tube 43 by entering the mount hole 214 in the cutting blade 21 housed in the upstanding tube 43. According to the first embodiment, the positioning post 44 is of a tapered cylindrical shape whose outside diameter is progressively smaller in a direction away from the transport jig 41. When the cutting blade 21 is installed on the positioning post 44, the surface of the cutting blade 21 that defines the mount hole 214 is brought into contact with and fixed to the outer circumferential surface of the positioning post 44 before the cutting edge 213 of the cutting blade 21 contacts the bottom surface 45. The cutting edge 213 is thus prevented from directly contacting the blade rest 42.

While cutting blades 21 are being placed on the blade rests 42, the transport jig 41 can be housed in the consumable part housing container 40 and can be transported by the transport unit 80 in the same manner as the annular frame 211. Specifically, the transport jig 41 is transported between a cassette 51 and the holding table 10 by the transport unit 80 that is shared by workpieces 200. The transport jig 41 according to the first embodiment includes an outer edge portion 46 extending outside of the upstanding tubes 43, i.e., the bottom surfaces 45, of the blade rests 42. The outer edge portion 46 outside of the rest surfaces acts as a held portion which is to be held by the transport unit 80.

The transport jig 41 places replacement cutting blades 21 as replacement consumable parts to be mounted on the cutting units 20 and used cutting blades 21 as used consumable parts removed from the cutting units 20, over the bottom surfaces 45 of the blade rests 42. According to the present embodiment, the blade rests 42 of the transport jig 41 are grouped in advance into blade rests 42 for placing replacement cutting blades 21 thereon and blade rests 42 for placing used cutting blades 21 thereon.

The cassette 51 is a box-shaped housing case for housing workpieces 200 therein. The cassette 51 houses a plurality of workpieces 200 before and after they are cut at spaced intervals along the Z-axis directions. The cassette 51 has a plurality of slots 52 for housing therein respective workpieces 200 at the spaced intervals along the Z-axis directions. Workpieces 200 can be taken into and out of the cassette 51 through an opening on the cleaning unit 70 side. The cassette 51 is disposed on the consumable part housing container 40.

The cassette elevator 50 lifts and lowers the consumable part housing container 40 and the cassette 51 along the Z-axis directions.

The table cover 60 is disposed adjacent to the holding table 10 at the loading/unloading position 92 in the Y-axis directions. The table cover 60 is in the form of a flat plate and angularly movable about hinges 61 on an outer edge portion of the apparatus base 2. The table cover 60 is angularly moved by an actuator, not illustrated, between a standby position, indicated by the solid lines in FIG. 1, where both surfaces of the table cover 60 lie parallel to the vertical directions and are retracted from the holding surface 11 of the holding table 10 and a table protecting position, indicated by the two-dot-and-dash lines in FIG. 1, where the both surfaces of the table cover 60 lie parallel to the horizontal directions and overlap the holding surface 11 of the holding table 10. When the cutting blades 21 mounted on the cutting units 20 are to be changed, the table cover 60 is placed in a table protecting position, and the transport jig 41 is temporarily placed thereon.

The cleaning unit 70 includes a spinner table 71 for holding a workpiece 200 under suction thereon, the spinner table 71 being rotatable about its own central axis parallel to the Z-axis directions, and a cleaning liquid supply nozzle, not illustrated, for supplying a cleaning liquid to the workpiece 200 held under suction on the spinner table 71. According to the first embodiment, the cleaning unit 70 is disposed adjacent to the cassette elevator 50, i.e., the cassette 51, and the consumable part housing container 40 in the X-axis directions, and is also disposed adjacent to the holding table 10 at the loading/unloading position 92 in the Y-axis directions.

For cutting a workpiece 200, the transport unit 80 transports the workpiece 200 from the cassette 51 successively to the holding table 10, the cleaning unit 70, and the cassette 51. For changing the cutting blades 21 mounted on the cutting units 20, the transport unit 80 transports a transport jig 41 from the consumable part housing container 40 onto the table cover 60 in the table protecting position and transports a transport jig 41 from the table cover 60 into the consumable part housing container 40.

As illustrated in FIG. 1, the transport unit 80 includes a pair of transport arms 81 and a pair of centering guides 82. According to the first embodiment, the transport arms 81 include respective cylinder units 83 movably disposed on the apparatus base 2 for movement in the X-axis directions and the Y-axis directions and extending downwardly, and respective suction members 85 mounted on the distal ends of respective rods 84 of the cylinder units 83. The rods 84 of the cylinder units 83 are extensible and contractible in directions parallel to the Z-axis directions. The suction members 85 are capable of holding annular frames 211 under suction and also of holding the outer edge portions 46 of transport jigs 41 under suction. Furthermore, on the suction member 85 of one of the transport units 80, there is mounted a loading/unloading unit 86 for holding an annular frame 211 or the outer edge portion 46 of a transport jig 41 and taking the workpiece 200 into and out of the cassette 51 or taking the transport jig 41 into and out of the consumable part housing container 40.

The centering guides 82 are disposed adjacent to the cassette elevator 50, i.e., the cassette 51, and the consumable part housing container 40 in the X-axis directions, and are spaced from each other in the Y-axis directions. The centering guides 82 are of a straight shape parallel to the X-axis directions, and have respective rest walls 87 for receiving the annular frame 211 and the transport jig 41 placed thereon and respective positioning walls 88 erected from the edges of the rest walls 87 that are remote from each other. The centering guides 82 are movable in the Y-axis directions by an actuating mechanism, not illustrated, and can be moved toward and away from each other by the actuating mechanism.

When one of the transport arms 81 is moved and the rod 84 of the cylinder unit 83 thereof is extended and contracted while the transport arms 81 are being spaced from each other, the loading/unloading unit 86 of the transport unit 80 holds an annular frame 211 that holds a workpiece 200 in the cassette 51, and unloads the annular frame 211 from the cassette 51 onto the rest walls 87 of the centering guides 82. Similarly, the loading/unloading unit 86 of the transport unit 80 holds a transport jig 41 in the consumable part housing container 40 and unloads the transport jig 41 from the consumable part housing container 40 onto the rest walls 87 of the centering guides 82.

The transport unit 80 moves the centering guides 82 toward each other to cause the positioning walls 88 to position the workpiece 200 or the transport jig 41 in the Y-axis directions. The suction member 85 of one of the transport units 80 holds the annular frame 211 or the transport jig 41 under suction, and the cylinder unit 83 of one of the transport arms 81 is moved in the Y-axis directions and the rod 84 of the cylinder unit 83 is extended and contracted, thereby transporting the workpiece 200 held under suction onto the holding surface 11 of the holding table 10 or transporting the transport jig 41 held under suction onto the table cover 60 in the table protecting position.

The other transport arm 81 of the transport unit 80 transports a workpiece 200 that has been cut to the spinner table 71 of the cleaning unit 70. The one transport arm 81 transports the cleaned workpiece 200 onto the rest walls 87 of the centering guides 82, after which the loading/unloading unit 86 houses the workpiece 200 into the cassette 51. The one transport arm 81 also transports the transport jig 41 on the table cover 60, on which a used cutting blade 21 has been placed, onto the rest walls 87 of the centering guides 82, after which the loading/unloading unit 86 houses the transport jig 41 into the consumable part housing container 40.

The line scanner 110 is disposed over the centering guides 82 in a transport route along which the transport unit 80 transports transport jigs 41. The line scanner 110 captures an image of cutting blades 21 placed on a transport jig 41 that is unloaded from the consumable part housing container 40 onto the centering guides 82. According to the first embodiment, the line scanner 110 extends parallel to the Y-axis directions and includes a plurality of image capturing sensors, not illustrated, arrayed in the Y-axis directions for capturing an image of the transport jig 41 unloaded on the centering guides 82 over its entire length along the Y-axis direction. The line scanner 110 outputs the captured image of the transport jig 41, which also includes cutting blades 21, to the control unit 100.

(Blade Changing Unit)

Figure 7:
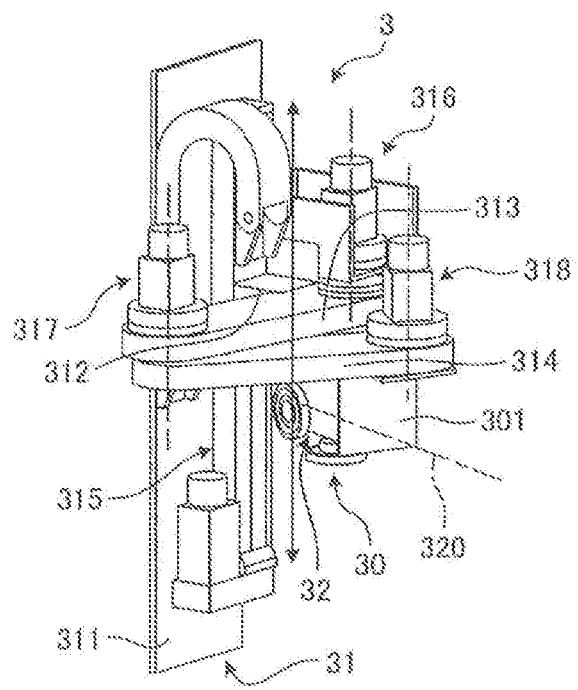
FIG. 7 is a perspective view illustrating a configuration example of a blade changing unit of the cutting apparatus illustrated in FIG. 1.
Figure 8:
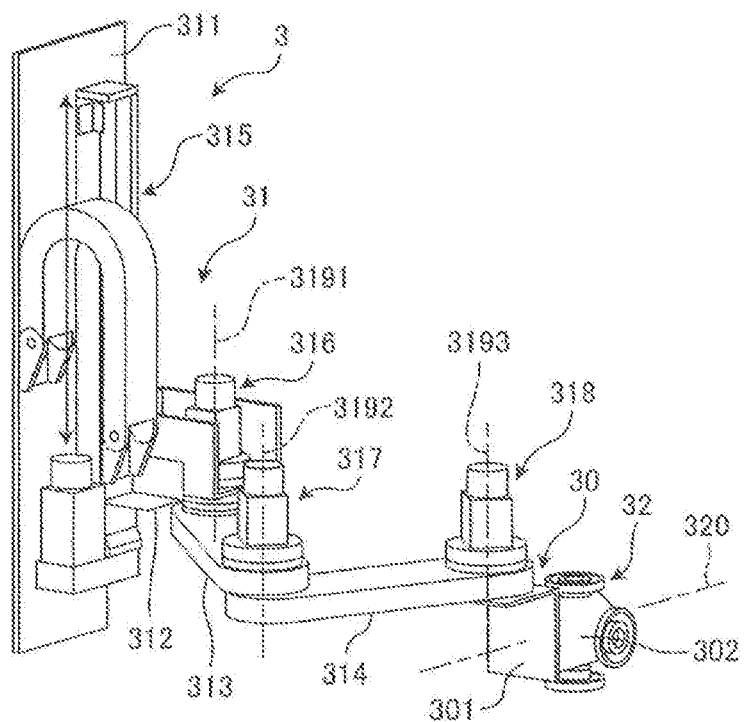
FIG. 8 is another perspective view illustrating the configuration example of the blade changing unit of the cutting apparatus illustrated in FIG. 1.
Figure 9:
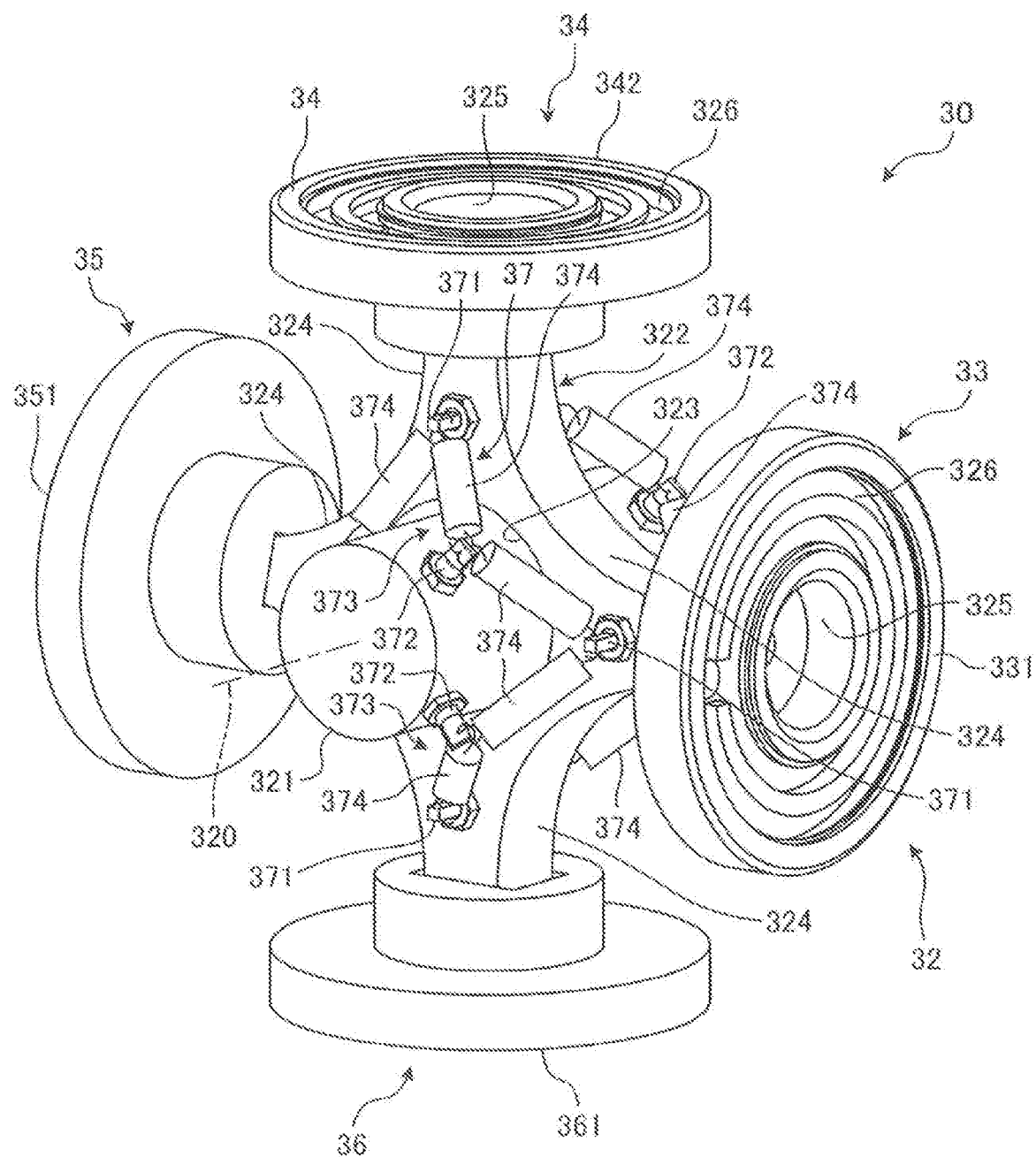
FIG. 9 is a perspective view illustrating a configuration example of a changing apparatus of the blade changing unit illustrated in FIG. 7.
Figure 10:
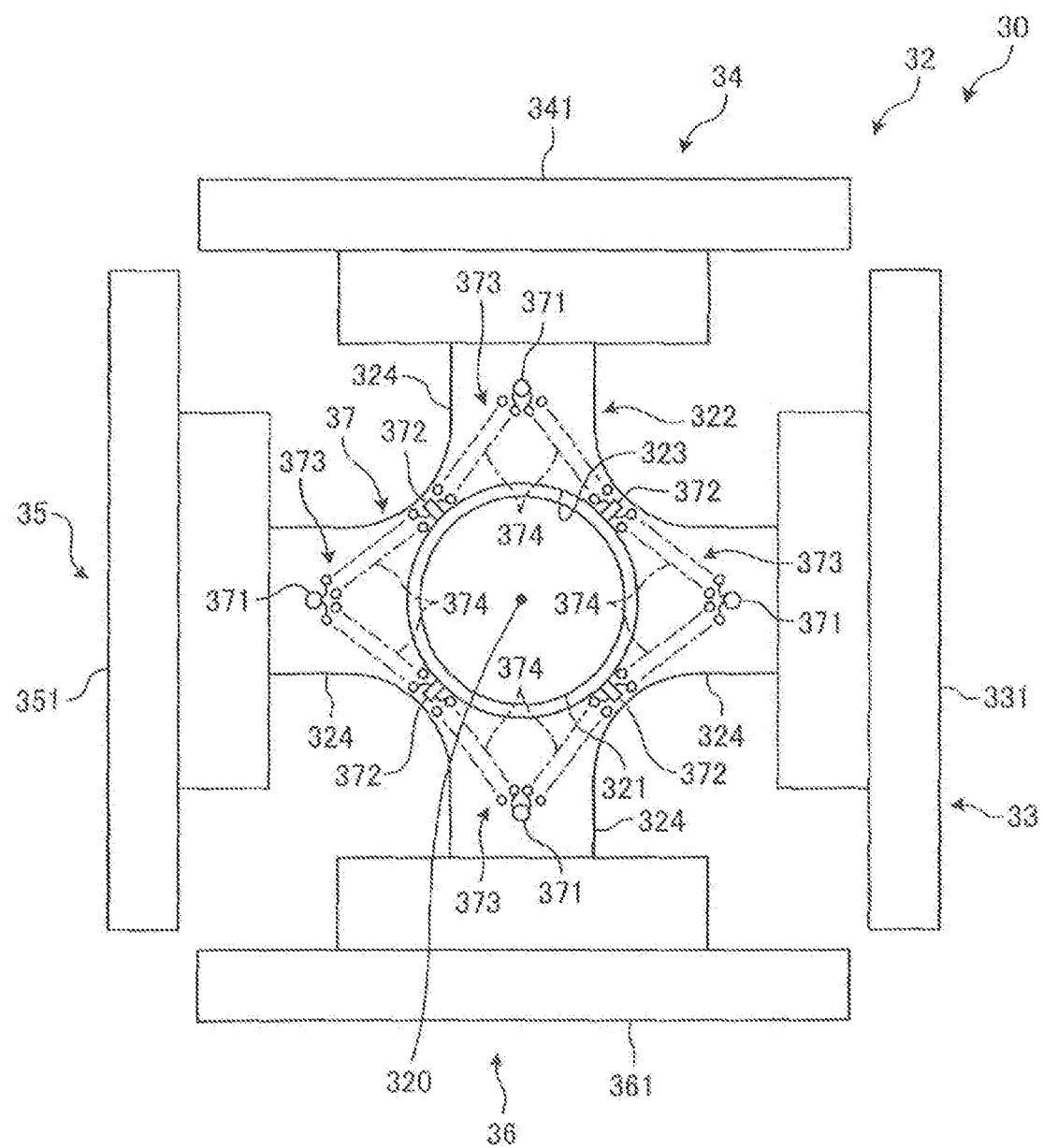
FIG. 10 is a front elevational view of the changing apparatus illustrated in FIG. 9.

The blade changing unit 3 will be described below with reference to FIGS. 1 and 7 through 10. FIG. 7 is a perspective view illustrating a configuration example of the blade changing unit of the cutting apparatus illustrated in FIG. 1. FIG. 8 is another perspective view illustrating the configuration example of the blade changing unit of the cutting apparatus illustrated in FIG. 1. FIG. 9 is a perspective view illustrating a configuration example of a changing apparatus of the blade changing unit illustrated in FIG. 7. FIG. 10 is a front elevational view of the changing apparatus illustrated in FIG. 9.

As illustrated in FIGS. 1, 7, and 8, the blade changing unit 3 includes a changing apparatus 30 for changing cutting blades 21 mounted on the cutting units 20 and a moving unit 31 as moving means. According to the first embodiment, as illustrated in FIG. 1, the blade changing unit 3 is disposed adjacent to the holding table 10 in the loading/unloading position 92 in the Y-axis directions, with the table cover 60 disposed between the blade changing unit 3 and the holding table 10. Therefore, the changing apparatus 30 of the blade changing unit 3 is located outside of the processing chamber 91.

The moving unit 31 moves the changing apparatus 30 between a standby position illustrated in FIGS. 1 and 7 in which the changing apparatus 30 is retracted from the cutting units 20 in the processing chamber 91 and also from the holding surface 11 of the holding table 10 in the loading/unloading position 92, and a changing position illustrated in FIG. 8 in which the changing apparatus 30 changes the cutting blades 21 on the cutting units 20 in the processing chamber 91.

According to the first embodiment, the moving unit 31 includes a base 311 fixed to the apparatus base 2, etc., a vertically movable member 312, a first rotary arm 313, a second rotary arm 314, a vertically moving mechanism 315, a first rotating mechanism 316, a second rotating mechanism 317, and a third rotating mechanism 318. The base 311 is of a straight shape parallel to the Z-axis directions. According to the first embodiment, the base 311 extends upwardly from an upper surface of the apparatus base 2. The vertically movable member 312 is movably mounted on the base 311 for movement in the Z-axis directions.

The first rotary arm 313 and the second rotary arm 314 extend in a straight shape. The first rotary arm 313 has an end rotatably supported on the vertically movable member 312 for rotation about a first rotational axis 3191 parallel to the Z-axis directions. The other end of the first rotary arm 313 and an end of the second rotary arm 314 are rotatably supported on each other for rotation about a second rotational axis 3192 parallel to the Z-axis directions. The changing apparatus 30 is rotatably supported on the other end of the second rotary arm 314 for rotation about a third rotational axis 3193 parallel to the Z-axis directions.

The vertically moving mechanism 315 moves the vertically movable member 312 in the Z-axis directions with respect to the base 311. The first rotating mechanism 316 rotates the end of the first rotary arm 313 about the first rotational axis 3191 with respect to the vertically movable member 312. The second rotating mechanism 317 rotates the other end of the first rotary arm 313 and the end of the second rotary arm 314 about the second rotational axis 3192 with respect to each other. The third rotating mechanism 318 rotates the changing apparatus 30 about the third rotational axis 3193 with respect to the other end of the second rotary arm 314.

The changing apparatus 30 includes an apparatus body 301, a rotating mechanism 302, and a changing unit 32. The apparatus body 301 is rotatably supported on the other end of the second rotary arm 314 for rotation about the third rotational axis 3193, and can be rotated about the third rotational axis 3193 by the third rotating mechanism 318. The rotating mechanism 302 rotates the changing unit 32 about a central axis 320 parallel to horizontal directions with respect to the apparatus base 2.

As illustrated in FIGS. 9 and 10, the changing unit 32 includes a rotational shaft 321 having a central axis 320, a support member 322, a first holder 33, a second holder 34, a third holder 35, and a fourth holder 36. The rotational shaft 321 is of a cylindrical shape and can be rotated about the central axis 320 by the rotating mechanism 302.

The support member 322 has a through hole 323 defined centrally therein through which the rotational shaft 321 extends, and includes a plurality of radially outward extensions 324 extending radially outwardly from the center of the support member 322. The through hole 323 has an inside diameter larger than the outside diameter of the rotational shaft 321. According to the first embodiment, the support member 322 has four outward extensions 324. According to the present invention, however, the support member 322 may have at least two outward extensions 324. The outward extensions 324 are disposed at circumferentially spaced intervals. According to the first embodiment, the outward extensions 324 are disposed at circumferentially spaced equal intervals.

The support member 322 is coupled by a joint assembly 37 to the rotational shaft 321 that extends through the through hole 323. The joint assembly 37 includes extension fittings 371 disposed on the outward extensions 324, shaft fittings 372 disposed on an outer circumferential surface of the rotational shaft 321, and resilient member pairs 373 associated respectively with the extension fittings 371. The extension fittings 371 protrude from the respective centers in widthwise and lengthwise directions of the axially opposite surfaces of the outward extensions 324. In other words, two extension fittings 371 are disposed on each of the outward extensions 324, so that the joint assembly 37 has a total of eight extension fittings 371 according to the first embodiment.

The shaft fittings 372 protrude from the outer circumferential surface of the rotational shaft 321 in as many as the number of the extension fittings 371. According to the first embodiment, specifically, the joint assembly 37 has a total of eight shaft fittings 372 according to the first embodiment. Of the shaft fittings 372, one half, i.e., four shaft fittings 372, are disposed at circumferentially spaced equal intervals on the outer circumferential surface of the rotational shaft 321 on one axial side of the support member 322. The remaining four shaft fittings 372 are disposed at circumferentially spaced equal intervals on the outer circumferential surface of the rotational shaft 321 on the other axial side of the support member 322. With the rotational shaft 321 extending through the through hole 323, according to the first embodiment, the four shaft fittings 372 on one axial side of the support member 322 and the other four shaft fittings 372 on the other axial side of the support member 322 are spaced from each other along the central axis 320 across the support member 322.

The resilient member pairs 373 are available in as many as the number of extension fittings 371 and the number of shaft fittings 372. In other words, the joint assembly 37 has a total of eight resilient member pairs 373. Each of the resilient member pairs 373 includes a pair of helical springs 374 as resilient members. According to the first embodiment, the helical springs 374 are used as the resilient members. According to the present invention, however, the resilient members are not limited to the helical springs 374. The helical springs 374 of each of the resilient member pairs 373 have ends joined to a corresponding one of the extension fittings 371 and other ends joined to adjacent two, that are closest to each other and circumferentially next to each other, of the shaft fittings 372 on the rotational shaft 321 extending through the through hole 323. Therefore, two helical springs 374 have ends joined to each of the extension fittings 371, and two helical springs 374 have other ends joined to each of the shaft fittings 372.

Each of the helical springs 374 normally urges the extension fitting 371 and the shaft fitting 372 to which it is joined to move toward each other. According to the first embodiment, all of the helical springs 374 have equal urging forces. As described above, the outward extensions 324 are disposed at circumferentially spaced intervals, the extension fittings 371 are disposed on the axially opposite surfaces of the outward extensions 324, one half of the shaft fittings 372 on one side of the support member 322 and the remaining half of the shaft fittings 372 on the other side of the support member 322 are axially spaced from each other along the central axis 320, and the helical springs 374 of each of the resilient member pairs 373 have ends joined to a corresponding one of the extension fittings 371 and other ends joined to adjacent two, that are closest to each other and circumferentially next to each other, of the shaft fittings 372 on the rotational shaft 321 extending through the through hole 323. Consequently, the joint assembly 37 normally urges the rotational shaft 321 and the support member 322 under the urging forces of the helical springs 374 to make the rotational shaft 321 and the through hole 323 coaxial with each other and make the directions in which the outward extensions 324 extend perpendicular to the central axis 320. The joint assembly 37 keeps the rotational shaft 321 and the support member 322 in relative positions where the rotational shaft 321 and the through hole 323 are coaxial with each other and the directions in which the outward extensions 324 extend are perpendicular to the central axis 320.

The first holder 33, the second holder 34, the third holder 35, and the fourth holder 36 are mounted on respective radially outward distal ends of the outward extensions 324. The first holder 33 on the radially outward distal end of the corresponding outward extension 324 has a first holding surface 331 facing in a radially outward direction from the rotational shaft 321 perpendicularly to the central axis 320. The second holder 34 on the radially outward distal end of the corresponding outward extension 324 has a second holding surface 341 facing in a radially outward direction from the rotational shaft 321 perpendicularly to the central axis 320. The third holder 35 on the radially outward distal end of the corresponding outward extension 324 has a third holding surface 351 facing in a radially outward direction from the rotational shaft 321 perpendicularly to the central axis 320. The fourth holder 36 on the radially outward distal end of the corresponding outward extension 324 has a fourth holding surface 361 facing in a radially outward direction from the rotational shaft 321 perpendicularly to the central axis 320.

Since the support member 322 and the rotational shaft 321 are joined to each other by the joint assembly 37, the holding surfaces 331, 341, 351, and 361 of the respective first through fourth holders 33, 34, 35, and 36 are swingably joined to the rotational shaft 321 by the joint assembly 37 that has the helical springs 374.

With the support member 322 and the rotational shaft 321 being joined to each other by the joint assembly 37, the angles formed between adjacent ones of lines interconnecting the centers of the holding surfaces 331, 341, 351, and 361 and the central axis 320 of the rotational shaft 321, i.e., lines extending through the centers of the holding surfaces 331, 341, 351, and 361 perpendicularly to the central axis 320 of the rotational shaft 321, are equal to each other. According to the first embodiment, each of the angles is of 90 degrees. Therefore, with the support member 322 and the rotational shaft 321 being joined to each other by the joint assembly 37, the first holder 33, the second holder 34, the third holder 35, and the fourth holder 36 are disposed in respective positions spaced at angular intervals of 90 degrees around the central axis 320 of the rotational shaft 321. Consequently, the second holder 34, for example, is angularly spaced from the first holder 33 through a predetermined angle of 90 degrees around the central axis 320 of the rotational shaft 321.

According to the first embodiment, each of the first through fourth holders 33, 34, 35, and 36 holds the surface 215 of the support base 212 of a cutting blade 21 under suction thereon. According to the first embodiment, the first through fourth holders 33, 34, 35, and 36 are in the form of thick circular plates that are structurally equal to each other. Each of the first through fourth holders 33, 34, 35, and 36 has a mount hole 325 centrally therein for receiving therein the other end portion 244 of the boss 241 of the mount flange 24 and the positioning post 44. Each of the first through fourth holders 33, 34, 35, and 36 also has a suction holding mechanism 326 in the corresponding one of the holding surfaces 331, 341, 351, and 361 around the mount hole 325 for holding the support base 212 of a cutting blade 21 under suction forces from an evacuating source, not illustrated. According to the first embodiment, furthermore, each of the first through fourth holders 33, 34, 35, and 36 holds the surface 215 of the support base 212 of a cutting blade 21 under suction. According to the present invention, however, a cutting blade 21 may be held on each of the first through fourth holders 33, 34, 35, and 36 by any means other than the suction means.

While the cutting apparatus 1 is in its cutting operation, the moving unit 31 of the blade changing unit 3 moves the end of the first rotary arm 313 and the other end of the second rotary arm 314 closely to each other, causing the changing apparatus 30 to face the base 311 to thereby place the changing apparatus 30 in the standby position illustrated in FIGS. 1 and 7. For changing the cutting blade 21 on each of the cutting units 20, the moving unit 31 of the blade changing unit 3 moves the end of the first rotary arm 313 and the other end of the second rotary arm 314 away from each other, causing the changing apparatus 30 to face the cutting unit 20 to thereby place the changing apparatus 30 in the changing position illustrated in FIG. 8.

The control unit 100 controls the components described above of the cutting apparatus 1 to enable the cutting apparatus 1 to perform a processing operation on workpieces 200. The control unit 100 includes a computer having an arithmetic processing apparatus having a microprocessor such as a central processing unit (CPU), a storage apparatus having a memory such as a read only memory (ROM) or a random access memory (RAM), and an input/output interface apparatus. The arithmetic processing apparatus of the control unit 100 performs arithmetic processing operations according to computer programs stored in the storage apparatus and outputs control signals for controlling the cutting apparatus 1 through the input/output interface apparatus to the components of the cutting apparatus 1.

The control unit 100 is connected to a display unit, not illustrated, such as a liquid crystal display apparatus for displaying states and images of a processing operation and an input unit, not illustrated, used by the operator to register processing content information, etc. The input unit includes at least one of a touch panel incorporated in the display unit and an external input apparatus such as a keyboard.

(Processing Operation of Cutting Apparatus)

Figure 11:
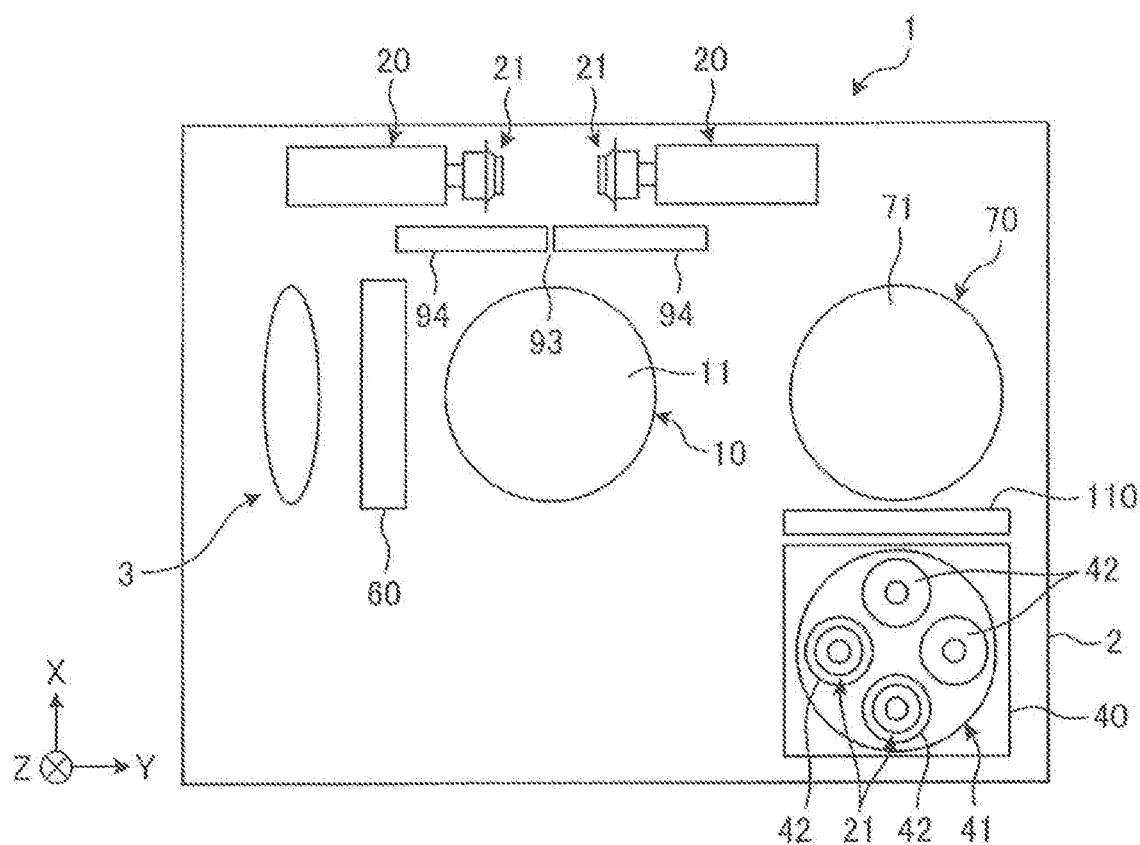
FIG. 11 is a plan view schematically illustrating a positional relation between components of the cutting apparatus illustrated in FIG. 1 immediately after the cutting apparatus has started its processing operation.

A processing operation of the cutting apparatus 1 of the above arrangement will be described below. FIG. 11 is a plan view schematically illustrating a positional relation between components of the cutting apparatus illustrated in FIG. 1 immediately after the cutting apparatus has started its processing operation. The operator places cutting blades 21 on those blade rests 42 of the transport jig 41 which hold replacement cutting blades 21, and registers processing content information in the control unit 100. According to the first embodiment, no cutting blades 21 are placed on those blade rests 42 of the transport jig 41 which hold used cutting blades 21. The processing content information includes the kinds of cutting blades 21 to be mounted on the cutting units 20, the positions of those blade rests 42 on which replacement cutting blades 21 are to be placed, and the positions of those blade rests 42 on which used cutting blades 21 are to be placed.

The operator houses the transport jig 41 with the cutting blades 21 placed on the blade rests 42 into the consumable part housing container 40, as illustrated in FIG. 11, houses workpieces 200 to be cut into the cassette 51, and places the cassette 51 on an upper surface of the consumable part housing container 40. In FIG. 11, only four of the blade rests 42 of the transport jig 41 are illustrated, and the other blade rests 42 are omitted from illustration.

Thereafter, the cutting apparatus 1 starts its processing operation in response to an instruction from the operator to start the processing operation. Prior to the processing operation, as illustrated in FIG. 11, the cutting apparatus 1 positions the table cover 60 in the standby position, positions the blade changing unit 3 in the standby position, and positions the cutting area covers 94 in the position in which they close the exit/entrance port 93. When the cutting apparatus 1 starts the processing operation, it causes the transport unit 80 to transport a workpiece 200 from the cassette 51 to the holding table 10 in the loading/unloading position 92. On the holding table 10, the cutting apparatus 1 holds the reverse side 204 of the workpiece 200 under suction on the holding surface 11 with the adhesive tape 210 interposed therebetween, and causes the clamps 12 to clamp the annular frame 211 in place.

The cutting apparatus 1 causes the X-axis moving unit to move the holding table 10 into processing chamber 91, and causes the image capturing unit to capture an image of the workpiece 200 held on the holding table 10. The cutting apparatus 1 performs the alignment process on the basis of the captured image. Then, while the cutting apparatus 1 is moving the workpiece 200 and the cutting units 20 relatively to each other along the projected dicing lines 202, the cutting apparatus 1 moves the cutting blades 21 to cut into the workpiece 200 along the projected dicing lines 202, dividing the workpiece 200 into individual devices 203. The cutting apparatus 1 causes the cleaning unit 70 to clean the workpiece 200 as divided into the individual devices 203, and then causes the transport unit 80 to house the workpiece 200 into the cassette 51. The cutting apparatus 1 causes the cutting units 20 to successively cut workpieces 200 supplied from the cassette 51. When the cutting apparatus 1 has completed the cutting of all the workpieces 200 from the cassette 51, the processing operation of the workpiece 200 is finished.

(Changing Method)

Figure 12:
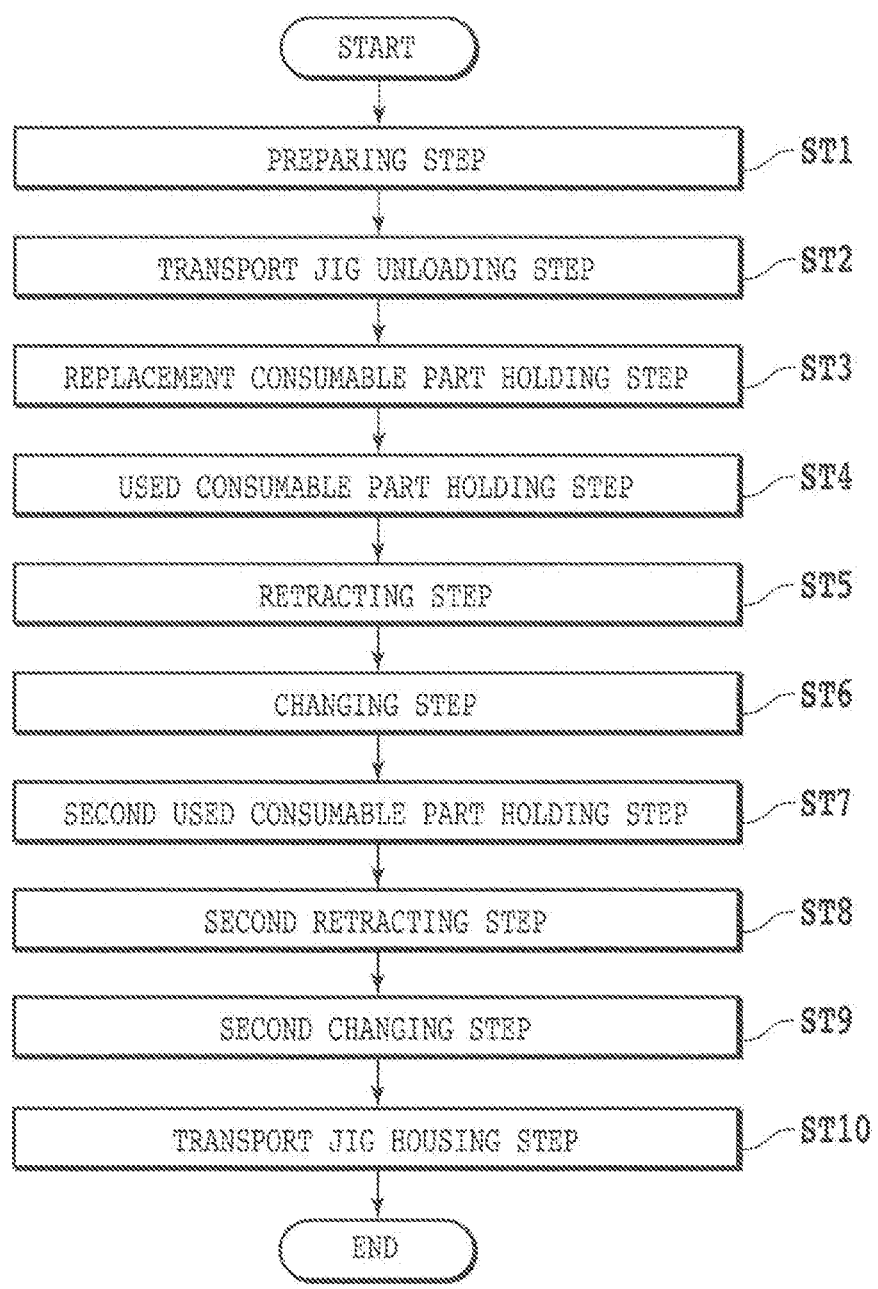
FIG. 12 is a flowchart of the sequence of a changing method according to the first embodiment.

A changing method according to the first embodiment will be described below. FIG. 12 is a flowchart of the sequence of the changing method according to the first embodiment. The changing method according to the first embodiment is carried out pursuant to the flowchart of FIG. 11 if the control unit 100 decides that the cutting blade 21 on at least one of the cutting units 20 has reached a blade change timing during the processing operation of the cutting apparatus 1 illustrated in FIG. 1. The blade change timing refers to a timing to change the cutting blade 21 on each of the cutting units 20. The blade change timing represents a timing reached each time a preset number of workpieces 200 have been cut, and is determined for each workpiece 200 and registered in the control unit 100 as part of the processing content information. The blade change timing according to the present invention may be reached while a single workpiece 200 is being processed or may be a timing to change workpieces 200 when a plurality of workpieces 200 are successively processed.

The changing method is a changing method for changing the cutting blades 21 mounted on the spindles 23 of the cutting units 20 by using the transport jig 41 in the cutting apparatus 1 illustrated in FIG. 1. While the changing method for changing the cutting blades 21 mounted on both the spindles 23 of the cutting units 20 will be described below, the cutting blade 21 mounted on the spindle 23 of either one of the cutting units 20 may be changed according to the present invention.

As illustrated in FIG. 12, the changing method includes preparing step ST1, transport jig unloading step ST2, replacement consumable part holding step ST3, used consumable part holding step ST4, retracting step ST5, changing step ST6, second used consumable part holding step ST7, second retracting step ST8, second changing step ST9, and transport jig housing step ST10. In FIGS. 13, 14, 15, 16, and 19, only four of the blade rests 42 of the transport jig 41 are illustrated, and the other blade rests 42 are omitted from illustration.

(Preparing Step)

Preparing step ST1 is a step of placing replacement cutting blades 21 (hereinafter denoted by 21-1) as replacement consumable parts on blade rests 42 of the transport jig 41 that has the blade rests 42 for holding a plurality of cutting blades 21 placed thereon. According to the first embodiment, the replacement cutting blades 21-1 are unused new cutting blades 21. According to the present invention, the replacement cutting blades 21-1 may not necessarily be new ones and may be second-hand cutting blades 21. According to the first embodiment, preparing step ST1 is carried out prior to the processing operation of the cutting apparatus 1 as described above, housing the transport jig 41 with the replacement cutting blades 21-1 placed on the blade rests 42 into the consumable part housing container 40.

(Transport Jig Unloading Step)

Figure 13:
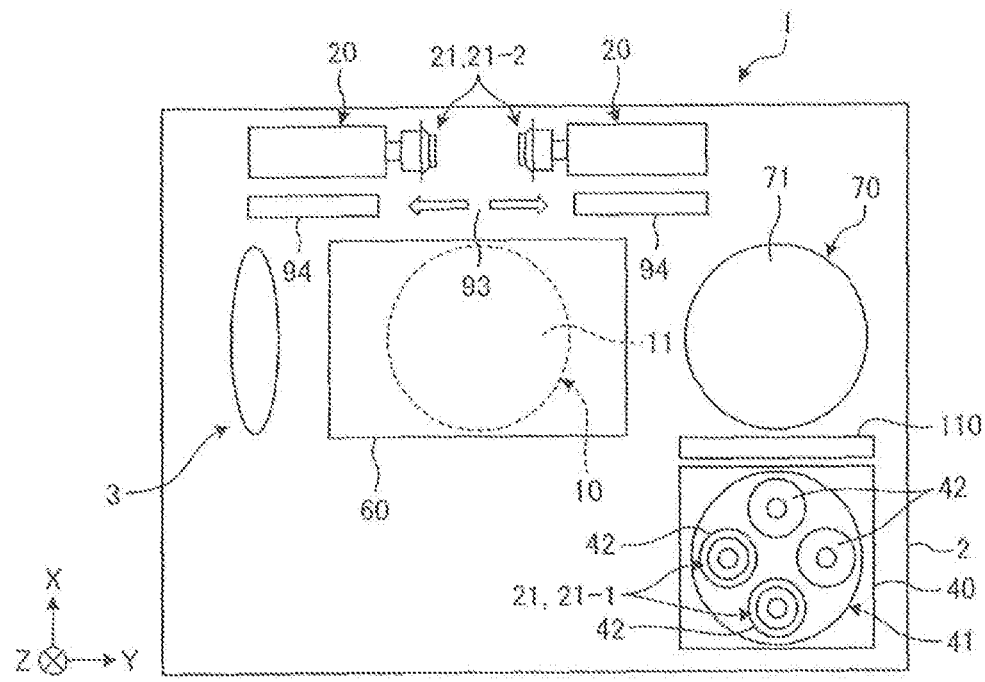
FIG. 13 is a plan view schematically illustrating a positional relation between the components of the cutting apparatus when cutting area covers open an exit/entrance port and a table cover is positioned in a table protecting position in a transport jig unloading step of the changing method illustrated in FIG. 12.
Figure 14:
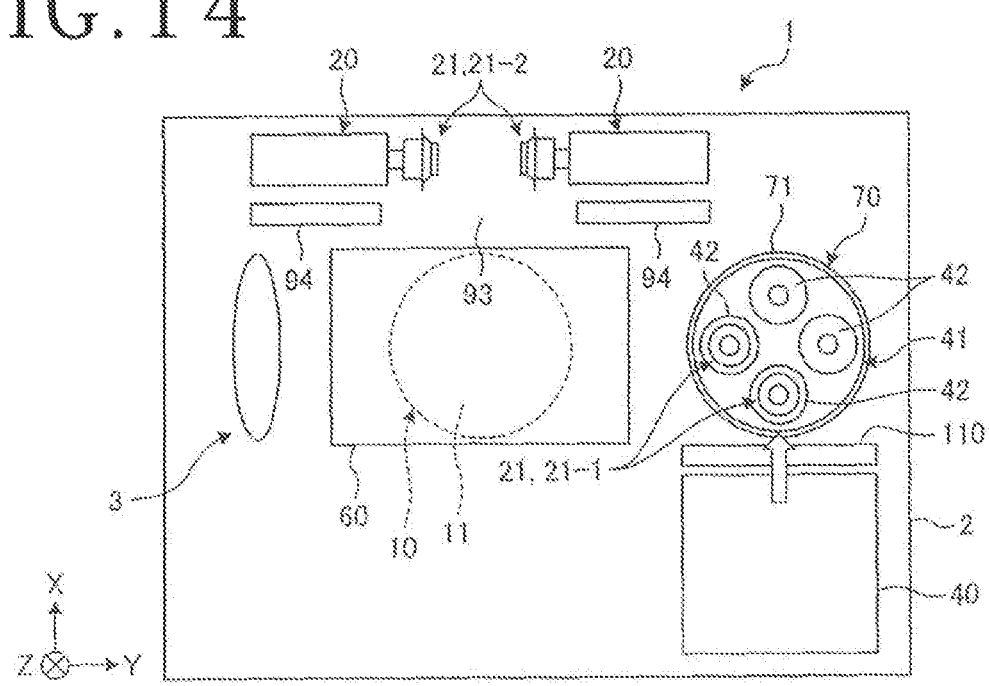
FIG. 14 is a plan view schematically illustrating a positional relation between the components of the cutting apparatus when the transport jig is positioned by a pair of centering guides in the transport jig unloading step of the changing method illustrated in FIG. 12.
Figure 15:
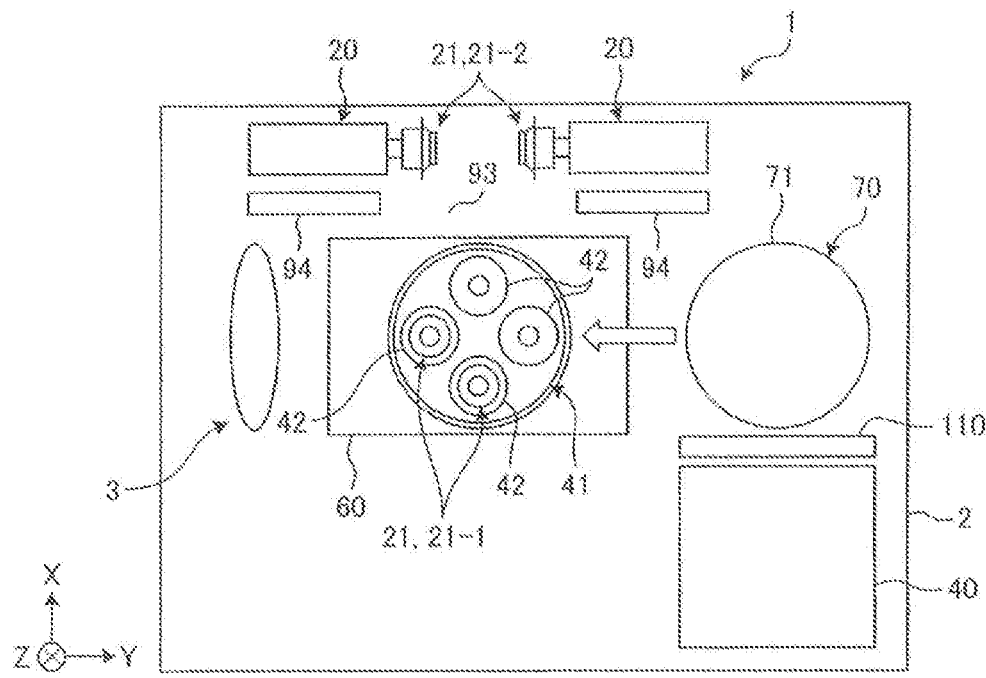
FIG. 15 is a plan view schematically illustrating a positional relation between the components of the cutting apparatus when the transport jig is placed on the table cover in the transport jig unloading step of the changing method illustrated in FIG. 12.

FIG. 13 is a plan view schematically illustrating a positional relation between the components of the cutting apparatus when the cutting area covers open the exit/entrance port and the table cover is positioned in the table protecting position in the transport jig unloading step of the changing method illustrated in FIG. 12. FIG. 14 is a plan view schematically illustrating a positional relation between the components of the cutting apparatus when the transport jig is positioned by the pair of centering guides in the transport jig unloading step of the changing method illustrated in FIG. 12. FIG. 15 is a plan view schematically illustrating a positional relation between the components of the cutting apparatus when the transport jig is placed on the table cover in the transport jig unloading step of the changing method illustrated in FIG. 12.

Transport jig unloading step ST2 is a step of taking the transport jig 41 out of the consumable part housing container 40 and transporting the transport jig 41 onto the table cover 60. In transport jig unloading step ST2, the cutting apparatus 1 positions the holding table 10 in the loading/unloading position 92, stops rotating the spindles 23 of the respective cutting units 20, moves the centering guides 82 away from each other, moves the cutting area covers 94 to open the exit/entrance port 93, and positions the table cover 60 in the table protecting position, as illustrated in FIG. 13.

In transport jig unloading step ST2, the cutting apparatus 1 causes the cassette elevator 50 to position the opening of the consumable part housing container 40 on the same plane as the rest walls 87 of the centering guides 82, and causes the loading/unloading unit 86 to take the transport jig 41 out of the consumable part housing container 40 and to move the transport jig 41 below the line scanner 110. At this time, the cutting apparatus 1 causes the line scanner 110 to capture an image of the transport jig 41, and thereafter places the transport jig 41 on the rest walls 87 of the centering guides 82, as illustrated in FIG. 14.

In transport jig unloading step ST2, the cutting apparatus 1 moves the centering guides 82 toward each other, positioning the transport jig 41 in the X-axis directions. In transport jig unloading step ST2, furthermore, the cutting apparatus 1 reads the identification mark 216 of the replacement cutting blade 21-1 placed on each of the blade rests 42, on the basis of the image captured by the line scanner 110, calculates the kind of the replacement cutting blade 21-1 placed on each of the blade rests 42, and calculates the positions of the replacement cutting blades 21-1 to be mounted on each of the cutting units 20 by referring to the processing content information.

In transport jig unloading step ST2, the cutting apparatus 1 causes one of the transport arms 81 of the transport unit 80 to hold under suction the transport jig 41 placed on the centering guides 82, transport the transport jig 41 to a position over the holding table 10, and place the transport jig 41 on the table cover 60, as illustrated in FIG. 15.

(Replacement Consumable Part Holding Step)

Figure 16:
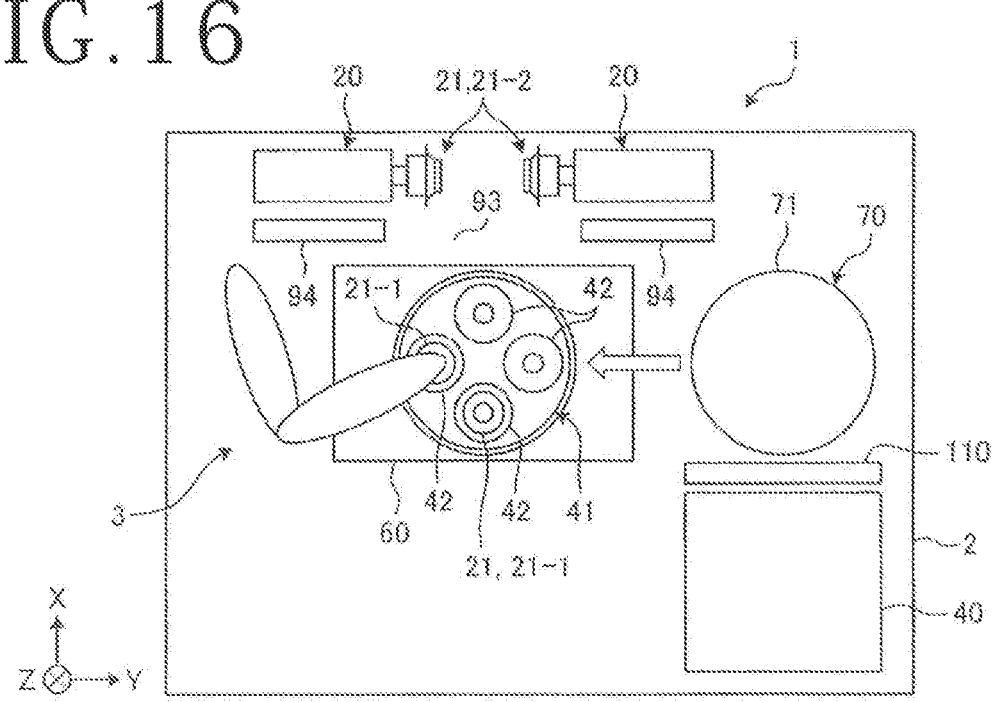
FIG. 16 is a plan view schematically illustrating a positional relation between the components of the cutting apparatus, depicting an outline of a replacement consumable part holding step of the changing method illustrated in FIG. 12.
Figure 17:
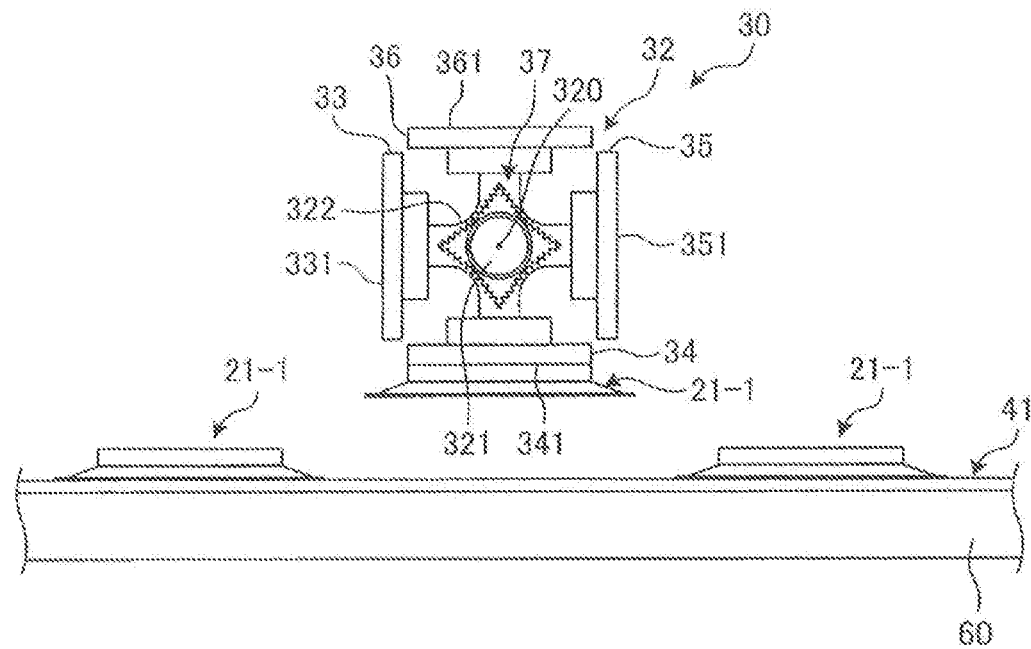
FIG. 17 is a side elevational view illustrating the manner in which a replacement cutting blade for a cutting unit is held on a second holding surface of a second holder of a changing unit in the replacement consumable part holding step of the changing method illustrated in FIG. 12.
Figure 18:
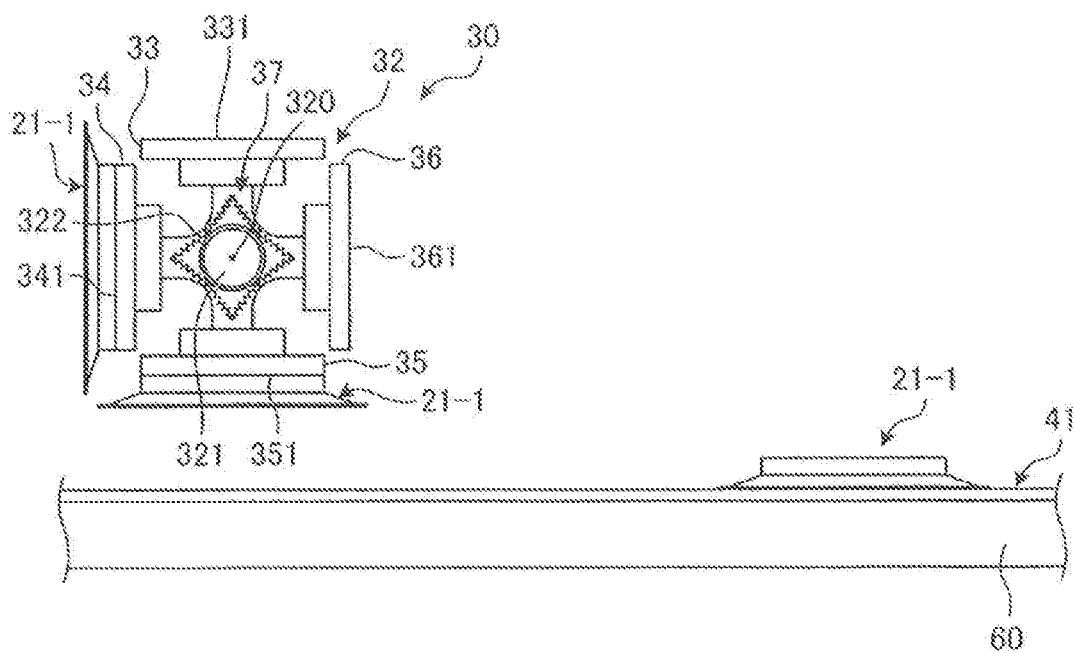
FIG. 18 is a side elevational view illustrating the manner in which a replacement cutting blade for another cutting unit is held on a third holding surface of a third holder of the changing unit in the replacement consumable part holding step of the changing method illustrated in FIG. 12.

FIG. 16 is a plan view schematically illustrating a positional relation between the components of the cutting apparatus, depicting an outline of the replacement consumable part holding step of the changing method illustrated in FIG. 12. FIG. 17 is a side elevational view illustrating the manner in which the replacement cutting blade for one of the cutting units is held on the second holding surface of the second holder of the changing unit in the replacement consumable part holding step of the changing method illustrated in FIG. 12. FIG. 18 is a side elevational view illustrating the manner in which the replacement cutting blade for the other cutting unit is held on the third holding surface of the third holder of the changing unit in the replacement consumable part holding step of the changing method illustrated in FIG. 12.

Replacement consumable part holding step ST3 is a step of holding the replacement cutting blade 21-1 for one of the cutting units 20, placed on one of the blade rests 42 of the transport jig 41, with the second holder 34 and also of holding the replacement cutting blade 21-1 for the other cutting unit 20, placed on the other blade rest 42, with the third holder 35. In replacement consumable part holding step ST3, as illustrated in FIG. 16, the cutting apparatus 1 moves the changing unit 32 of the changing apparatus 30 toward the transport jig 41 on the table cover 60.

In replacement consumable part holding step ST3, the cutting apparatus 1 places the second holding surface 341 of the second holder 34 of the changing unit 32 in overlapping relation to the support base 212 of the replacement cutting blade 21-1 to be mounted on the spindle 23 of one of the cutting units 20, causes the second holding surface 341 to hold the replacement cutting blade 21-1 under suction, and thereafter lifts the changing unit 32, as illustrated in FIG. 17. Furthermore, the cutting apparatus 1 places the third holding surface 351 of the third holder 35 of the changing unit 32 in overlapping relation to the support base 212 of the replacement cutting blade 21-1 to be mounted on the spindle 23 of the other cutting unit 20, causes the third holding surface 351 to hold the replacement cutting blade 21-1 under suction, and thereafter lifts the changing unit 32, as illustrated in FIG. 18. The second holder 34 and the third holder 35 thus hold the respective replacement cutting blades 21-1.

(Used Consumable Part Holding Step)

Figure 19:
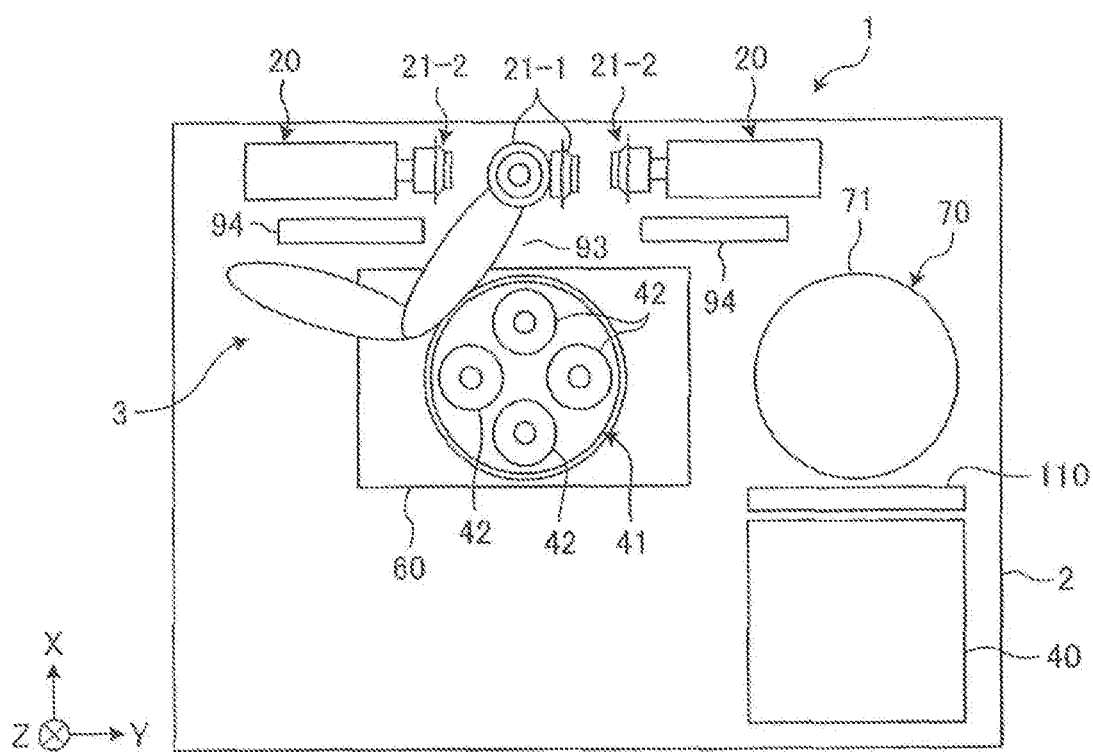
FIG. 19 is a plan view schematically illustrating a positional relation between the components of the cutting apparatus, depicting an outline of a used consumable part holding step of the changing method illustrated in FIG. 12.
Figure 20:
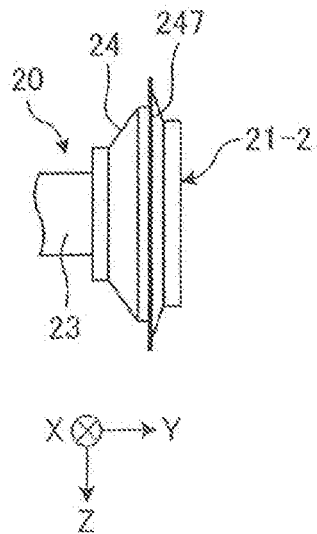
FIG. 20 is a side elevational view illustrating the manner in which a used cutting blade on a cutting unit is held on a first holding surface of a first holder of the changing unit in the used consumable part holding step of the changing method illustrated in FIG. 12.
Figure 20:
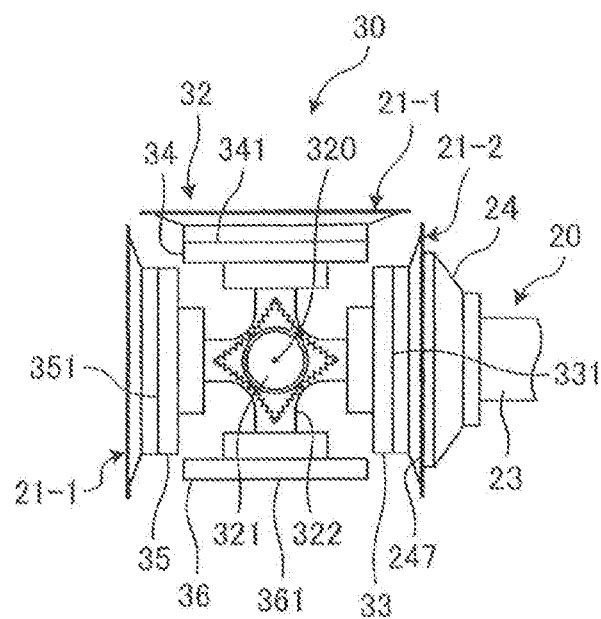

FIG. 19 is a plan view schematically illustrating a positional relation between the components of the cutting apparatus, depicting an outline of the used consumable part holding step of the changing method illustrated in FIG. 12. FIG. 20 is a side elevational view illustrating the manner in which a used cutting blade on one of the cutting units is held on the first holding surface of the first holder of the changing unit in the used consumable part holding step of the changing method illustrated in FIG. 12.

Used consumable part holding step ST4 is a step of positioning the central axis 320 of the rotational shaft 321 of the changing apparatus 30 parallel to the axial surface 247 of the mount land 246 of the mount flange 24 of one of the cutting units 20, causing the first holding surface 331 of the first holder 33 to face a used cutting blade 21 (hereinafter denoted by 21-2) as a used consumable part mounted on the one cutting unit 20. Used consumable part holding step ST4 is also a step of positioning the first holding surface 331 of the first holder 33 in a changing position for abutting against the used cutting blade 21-2 mounted on the one cutting unit 20, causing the first holder 33 to hold the used cutting blade 21-2 mounted on the one cutting unit 20.

In used consumable part holding step ST4, as illustrated in FIG. 19, the cutting apparatus 1 inserts the changing apparatus 30 of the blade changing unit 3 through the exit/entrance port 93 opened by the cutting area covers 94 into the processing chamber 91. The exit/entrance port 93 thus allows the changing apparatus 30 to move into and out of the processing chamber 91 therethrough.

In used consumable part holding step ST4, the cutting apparatus 1 causes the first holding surface 331 of the first holder 33 of the changing unit 32 to face the support base 212 of the used cutting blade 21-2 mounted on the spindle 23 of the one cutting unit 20 in spaced relation along the Y-axis directions. At this time, the cutting apparatus 1 keeps the central axis of the spindle 23 and the central axis 320 of the rotational shaft 321 perpendicular to each other, positioning the central axis of the spindle 23 and the first holding surface 331 of the first holder 33 coaxially with each other.

In used consumable part holding step ST4, the cutting apparatus 1 brings the changing unit 32 closely to the one cutting unit 20 along the Y-axis directions, positioning the changing apparatus 30 in a changing position in which the first holding surface 331 of the first holder 33 abuts against the support base 212 of the used cutting blade 21-2 mounted on the one cutting unit 20. The changing position referred to in the present invention represents a position in which either one of the holding surfaces 331, 341, 351, and 361 of the holders 33, 34, 35, and 36 of the changing unit 32 of the changing apparatus 30 abuts against the cutting blade 21 mounted on one of the cutting units 20.

In used consumable part holding step ST4, the cutting apparatus 1 holds the used cutting blade 21-2 mounted on the one cutting unit 20 under suction on the first holding surface 331 of the first holder 33 of the changing unit 32 of the changing apparatus 30, and stops holding the used cutting blade 21-2 under suction on the mount flange 24 of the spindle 23 of the one cutting unit 20.

(Retracting Step)

Figure 21:
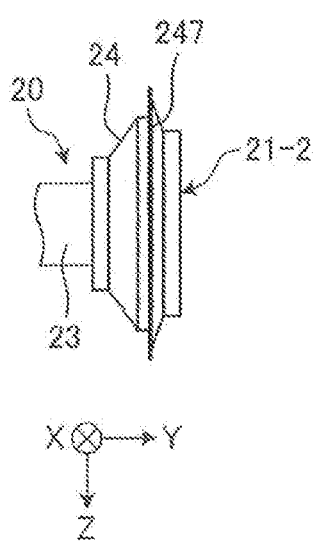
FIG. 21 is a side elevational view illustrating the manner in which the changing unit holding the used cutting blade from the cutting unit is retracted in a retracting step of the changing method illustrated in FIG. 12.
Figure 21:
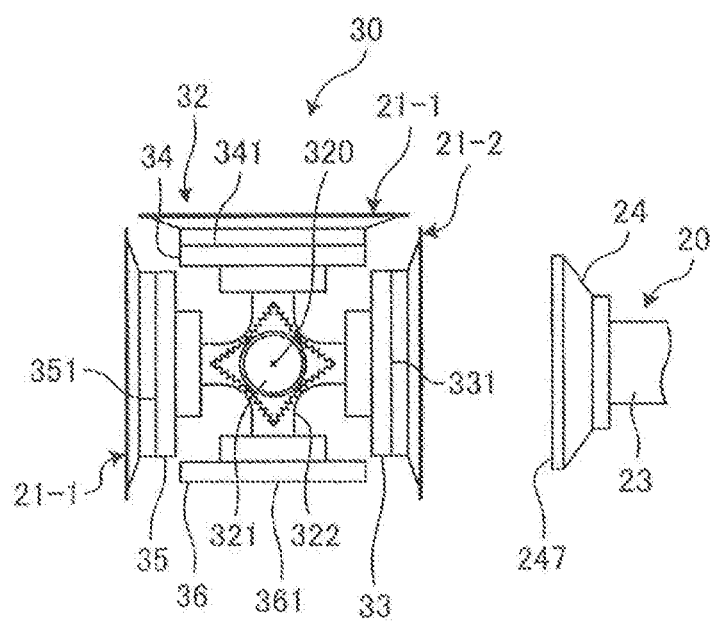

FIG. 21 is a side elevational view illustrating the manner in which the changing unit holding the used cutting blade from the one cutting unit is retracted in the retracting step of the changing method illustrated in FIG. 12.

Retracting step ST5 is a step of, after used consumable part holding step ST4, retracting the first holder 33 that has held the used cutting blade 21-2 from the changing position to a retracted position. In retracting step ST5, the cutting apparatus 1 moves the changing unit 32 away from the one cutting unit 20 along the Y-axis directions. In retracting step ST5, as illustrated in FIG. 21, the cutting apparatus 1 positions the changing apparatus 30 in the retracted position in which the used cutting blade 21-2 held under suction on the first holding surface 331 of the first holder 33 is spaced a distance from the mount flange 24 mounted on the distal end of the spindle 23 of the one cutting unit 20.

The retracted position referred to in the present invention thus represents a position in which either one of the holding surfaces 331, 341, 351, and 361 of the holders 33, 34, 35, and 36 of the changing unit 32 of the changing apparatus 30 that has held the used cutting blade 21-2 is sufficiently spaced a distance from the mount flange 24 of one of the cutting units 20. As described above, the moving unit 31 of the blade changing unit 3 moves the changing apparatus 30 between the changing position and the standby position described above.

(Changing Step)

Figure 22:
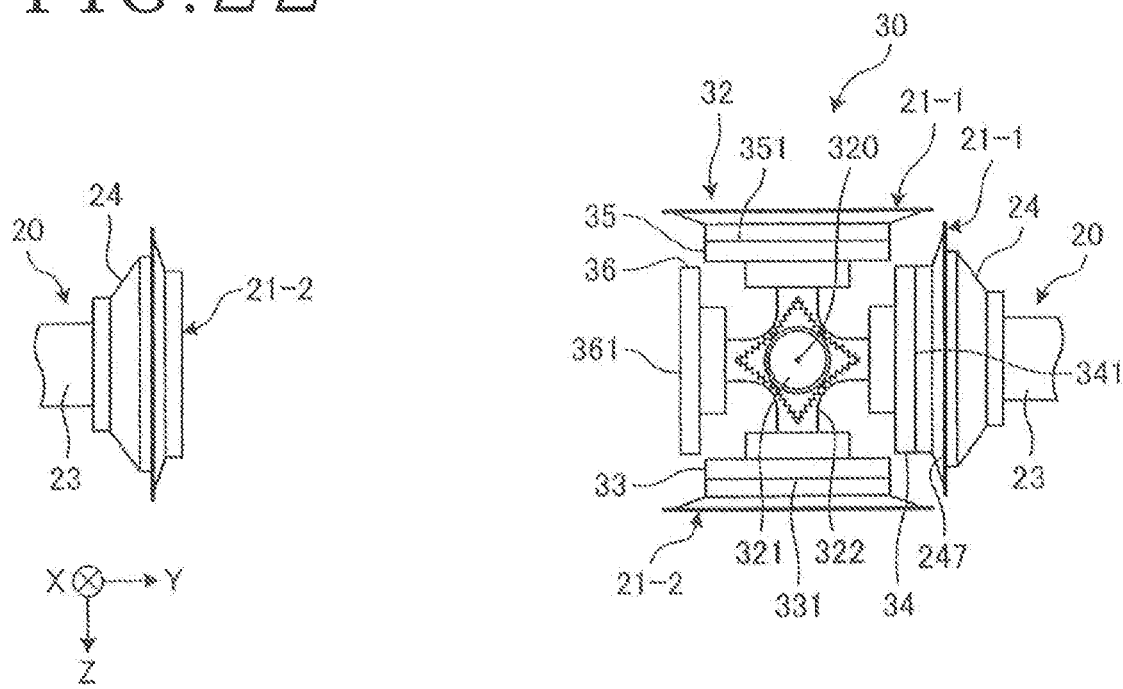
FIG. 22 is a side elevational view illustrating the manner in which the cutting unit holds a replacement cutting blade in a changing step of the changing method illustrated in FIG. 12.

FIG. 22 is a side elevational view illustrating the manner in which the cutting unit holds a replacement cutting blade in the changing step of the changing method illustrated in FIG. 12. Changing step ST6 is a step of rotating the rotational shaft 321 to bring the second holding surface 341 of the second holder 34 that has held the replacement cutting blade 21-1 into facing relation to the surface 247 of the mount land 246 of the mount flange 24 of the one cutting unit 20, positioning the second holder 34 in the changing position, and holding the replacement cutting blade 21-1 on the surface 247 of the mount land 246 of the mount flange 24 of the one cutting unit 20.

In changing step ST6, the cutting apparatus 1 rotates the rotational shaft 321 of the changing unit 32 of the changing apparatus 30 to bring the second holding surface 341 of the second holder 34 that has held the replacement cutting blade 21-1 for the one cutting unit 20 into facing relation to the surface 247 of the mount land 246 of the mount flange 24 of the one cutting unit 20 in spaced relation along the Y-axis directions. In changing step ST6, the cutting apparatus 1 moves the changing unit 32 of the changing apparatus 30 closely to the one cutting unit 20 along the Y-axis directions, positioning the replacement cutting blade 21-1 held under suction on the second holding surface 341 of the second holder 34 into abutment against the surface 247 of the mount land 246 of the mount flange 24 of the one cutting unit 20 to thereby position the changing apparatus 30 in the changing position, as illustrated in FIG. 22.

In changing step ST6, the cutting apparatus 1 holds the replacement cutting blade 21-1 under suction on the mount flange 24 of the one cutting unit 20 and stops holding the replacement cutting blade 21-1 under suction on the second holding surface 341 of the second holder 34 of the changing unit 32. In changing step ST6, the cutting apparatus 1 moves the changing unit 32 of the changing apparatus 30 away from the one cutting unit 20 along the Y-axis directions and positions the changing apparatus 30 in the retracted position.

(Second Used Consumable Part Holding Step)

Second used consumable part holding step ST7 is a step of positioning the central axis 320 of the rotational shaft 321 of the changing apparatus 30 parallel to the surface 247 of the mount land 246 of the mount flange 24 of the other cutting unit 20, causing the fourth holding surface 361 of the fourth holder 36 to face a used cutting blade 21-2 mounted on the other cutting unit 20. Second used consumable part holding step ST7 is also a step of positioning the fourth holding surface 361 of the fourth holder 36 in a changing position for abutting against the used cutting blade 21-2 mounted on the other cutting unit 20, causing the fourth holder 36 to hold the used cutting blade 21-2 mounted on the other cutting unit 20.

In second used consumable part holding step ST7, the cutting apparatus 1 causes the fourth holding surface 361 of the fourth holder 36 of the changing unit 32 to face the support base 212 of the used cutting blade 21-2 mounted on the spindle 23 of the other cutting unit 20 in spaced relation along the Y-axis directions. At this time, the cutting apparatus 1 keeps the central axis of the spindle 23 and the central axis 320 of the rotational shaft 321 perpendicular to each other, positioning the central axis of the spindle 23 and the fourth holding surface 361 of the fourth holder 36 coaxially with each other.

In second used consumable part holding step ST7, the cutting apparatus 1 brings the changing unit 32 closely to the other cutting unit 20 along the Y-axis directions, positioning the changing apparatus 30 in a changing position in which the fourth holding surface 361 of the fourth holder 36 abuts against the support base 212 of the used cutting blade 21-2 mounted on the other cutting unit 20.

In second used consumable part holding step ST7, the cutting apparatus 1 holds the used cutting blade 21-2 mounted on the other cutting unit 20 under suction on the fourth holding surface 361 of the fourth holder 36 of the changing unit 32 of the changing apparatus 30, and stops holding the used cutting blade 21-2 under suction on the mount flange 24 of the spindle 23 of the other cutting unit 20. The first holder 33 and the fourth holder 36 thus hold the used cutting blade 21-2.

(Second Retracting Step)

Second retracting step ST8 is a step of, after second used consumable part holding step ST7, retracting the fourth holder 36 that has held the used cutting blade 21-2 from the changing position to a retracted position. In second retracting step ST8, the cutting apparatus 1 moves the changing unit 32 away from the other cutting unit 20 along the Y-axis directions. In second retracting step ST8, the cutting apparatus 1 positions the changing apparatus 30 in the retracted position in which the used cutting blade 21-2 held under suction on the fourth holding surface 361 of the fourth holder 36 is spaced a distance from the mount flange 24 mounted on the distal end of the spindle 23 of the other cutting unit 20.

(Second Changing Step)

Figure 23:
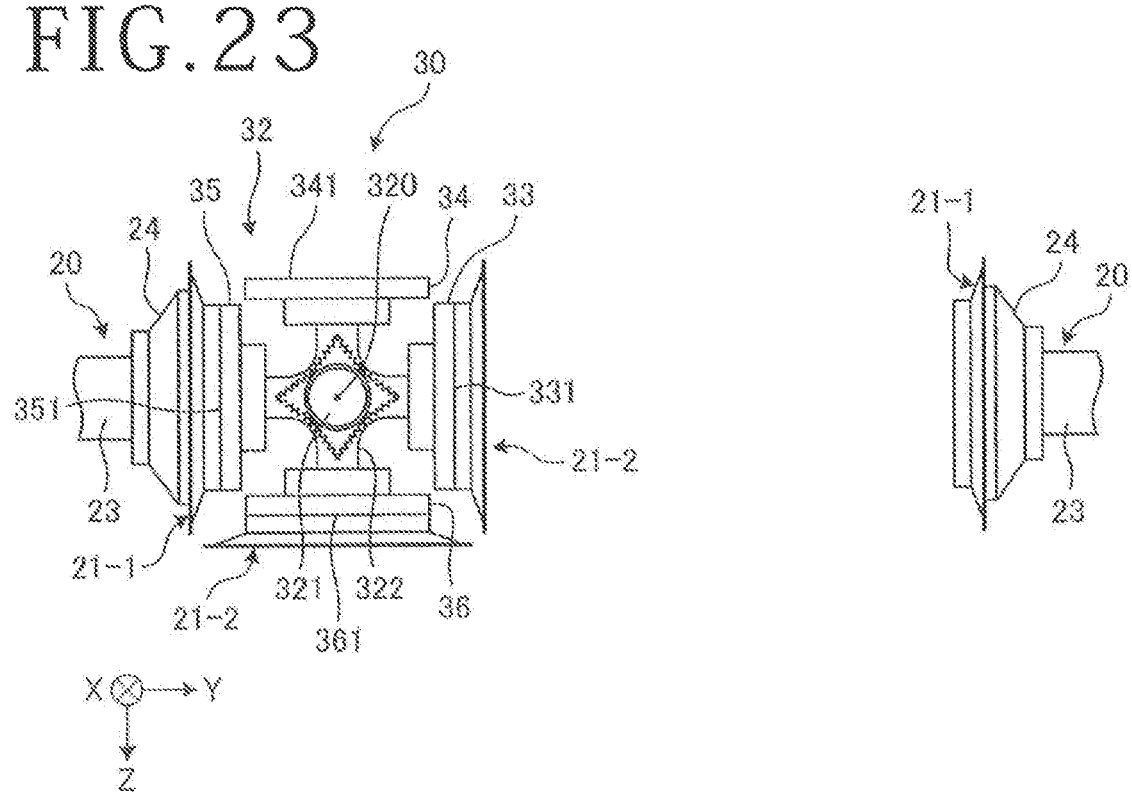
FIG. 23 is a side elevational view illustrating the manner in which another cutting unit holds a replacement cutting blade in a second changing step of the changing method illustrated in FIG. 12.

FIG. 23 is a side elevational view illustrating the manner in which the other cutting unit holds a replacement cutting blade in the second changing step of the changing method illustrated in FIG. 12. Second changing step ST9 is a step of rotating the rotational shaft 321 to bring the third holding surface 351 of the third holder 35 that has held the replacement cutting blade 21-1 into facing relation to the surface 247 of the mount land 246 of the mount flange 24 of the other cutting unit 20, positioning the third holder 35 in the changing position, and holding the replacement cutting blade 21-1 on the surface 247 of the mount land 246 of the mount flange 24 of the other cutting unit 20.

In second changing step ST9, the cutting apparatus 1 rotates the rotational shaft 321 of the changing unit 32 of the changing apparatus 30 to bring the third holding surface 351 of the third holder 35 that has held the replacement cutting blade 21-1 for the other cutting unit 20 into facing relation to the surface 247 of the mount land 246 of the mount flange 24 of the other cutting unit 20 in spaced relation along the Y-axis directions. In second changing step ST9, the cutting apparatus 1 moves the changing unit 32 of the changing apparatus 30 closely to the other cutting unit 20 along the Y-axis directions, positioning the replacement cutting blade 21-1 held under suction on the third holding surface 351 of the third holder 35 into abutment against the surface 247 of the mount land 246 of the mount flange 24 of the other cutting unit 20 to thereby position the changing apparatus 30 in the changing position, as illustrated in FIG. 23.

In second changing step ST9, the cutting apparatus 1 holds the replacement cutting blade 21-1 under suction on the mount flange 24 of the other cutting unit 20 and stops holding the replacement cutting blade 21-1 under suction on the third holding surface 351 of the third holder 35 of the changing unit 32. In second changing step ST9, the cutting apparatus 1 moves the changing unit 32 of the changing apparatus 30 away from the other cutting unit 20 along the Y-axis directions and positions the changing apparatus 30 in the retracted position.

(Transport Jig Housing Step)

Transport jig housing step ST10 is a step of placing the used cutting blade 21-2 held on the changing unit 32 of the changing apparatus 30 on the blade rest 42 of the transport jig 41 and housing the transport jig 41 with the used cutting blade 21-2 placed thereon into the consumable part housing container 40. In transport jig housing step ST10, the cutting apparatus 1 moves the changing apparatus 30 of the blade changing unit 3 onto the transport jig 41 on the table cover 60, and thereafter closes the exit/entrance port 93 with the cutting area covers 94.

In transport jig housing step ST10, the cutting apparatus 1 places the used cutting blades 21-2 held under suction on the first holder 33 and the fourth holder 36 of the blade changing unit 3 on respective blade rests 42, and thereafter stops holding the used cutting blades 21-2 under suction on the first holder 33 and the fourth holder 36. In transport jig housing step ST10, the cutting apparatus 1 moves the blade changing unit 3 to the standby position, causes the transport unit 80 to transport the transport jig 41 from the table cover 60 to the centering guides 82 and thereafter house the transport jig 41 into the consumable part housing container 40. In this manner, the cutting apparatus 1 changes the cutting blades 21 on the respective cutting units 20 according to the above changing method.

As described above, the cutting apparatus 1 according to the first embodiment has the changing apparatus 30 that includes the first holder 33 having the first holding surface 331 that faces outwardly of the rotational shaft 321 and the second holder 34 having the second holding surface 341 disposed in a position angularly spaced from the first holding surface 331 through a predetermined angle around the rotational shaft 321. Therefore, when the rotational shaft 321 rotates about the central axis 320, the first and second holding surfaces 331 and 341 are brought into facing relation to the cutting units 20. Consequently, the cutting apparatus 1 can change cutting blades 21 as consumable parts by positioning the changing apparatus 30 in positions facing the cutting units 20 along the central axes of the spindles 23, rotating the rotational shafts 321, and moving the changing apparatus 30 along the central axes of the spindles 23. As a result, the cutting apparatus 1 is advantageous in that it has a reduced space for changing the cutting blades 21.

Furthermore, the changing apparatus 30 includes, in addition to the first holder 33 and the second holder 34, the third holder 35 having the third holding surface 351 that faces outwardly of the rotational shaft 321 and the fourth holder 36 having the fourth holding surface 361 that faces outwardly of the rotational shaft 321. The first holder 33, the second holder 34, the third holder 35, and the fourth holder 36 are disposed in respective positions spaced at angular intervals of 90 degrees around the central axis 320 of the rotational shaft 321. Therefore, even though the cutting apparatus 1 has the pair of cutting units 20, the changing unit 32 of the changing apparatus 30 can hold replacement cutting blades 21-1 for the respective cutting units 20 and used cutting blades 21-2 from the respective cutting units 20. As a result, the cutting apparatus 1 is able to prevent the time required to change the cutting blades 21 on the respective cutting units 20 from increasing even though the cutting apparatus 1 has the pair of cutting units 20.

Moreover, in the cutting apparatus 1, the rotational shaft 321 of the changing unit 32 of the changing apparatus 30 and the support member 322 with the holders 33, 34, 35, and 36 mounted thereon are joined to each other by the joint assembly 37 including the helical springs 374, and the holding surfaces 331, 341, 351, and 361 are swingably coupled to the rotational shaft 321. As a consequence, even if the holding surfaces 331, 341, 351, and 361 of the respective holders 33, 34, 35, and 36 of the changing apparatus 30, and the blade rests 42 of the transport jig 41 and the cutting units 20 are positionally shifted, the cutting apparatus 1 can hold used cutting blades 21-2 from the cutting units 20 and install replacement cutting blades 21-1 on the cutting units 20.

In addition, as the blade changing unit 3 is disposed outside of the processing chamber 91, a mist containing chips produced in the processing chamber 91 is prevented from being deposited on the changing apparatus 30.

Furthermore, since the cutting apparatus 1 includes the line scanner 110 that captures an image of the cutting blades 21 placed on the transport jig 41, the cutting apparatus 1 can recognize the kinds of replacement cutting blades 21-1 placed on the transport jig 41.

Moreover, since the changing apparatus 30 changes cutting blades 21 as consumable parts, the cutting apparatus 1 is advantageous in that it has a reduced space for changing the cutting blades 21.

In addition, as the cutting apparatus 1 and the changing method change cutting blades 21 as consumable parts, the cutting blades 21 can be changed automatically.

Second Embodiment

Figure 24:
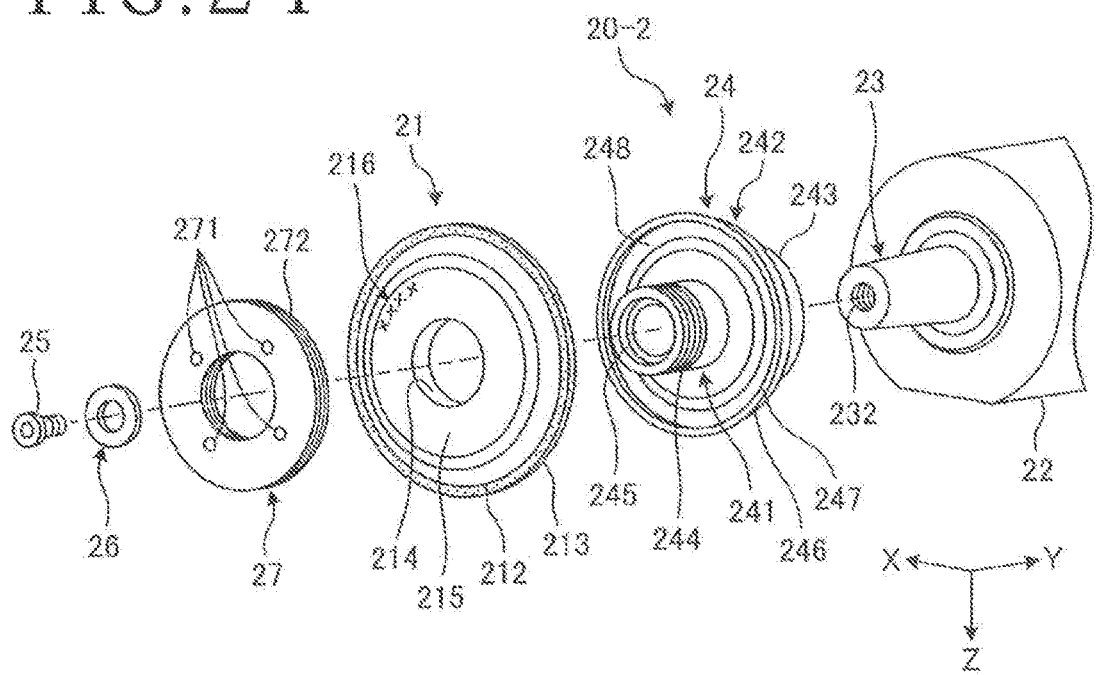
FIG. 24 is an exploded perspective view of a cutting unit of a cutting apparatus according to a second embodiment of the present invention.
Figure 25:
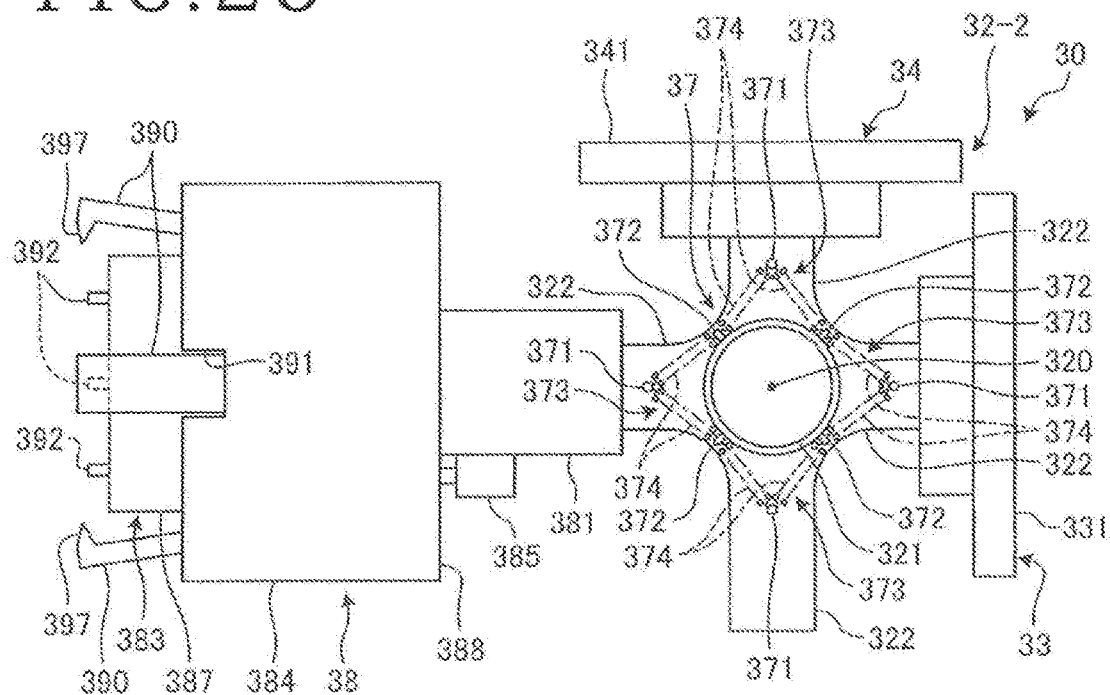
FIG. 25 is a front elevational view of a changing apparatus of a blade changing unit of the cutting apparatus illustrated in FIG. 24.
Figure 26:
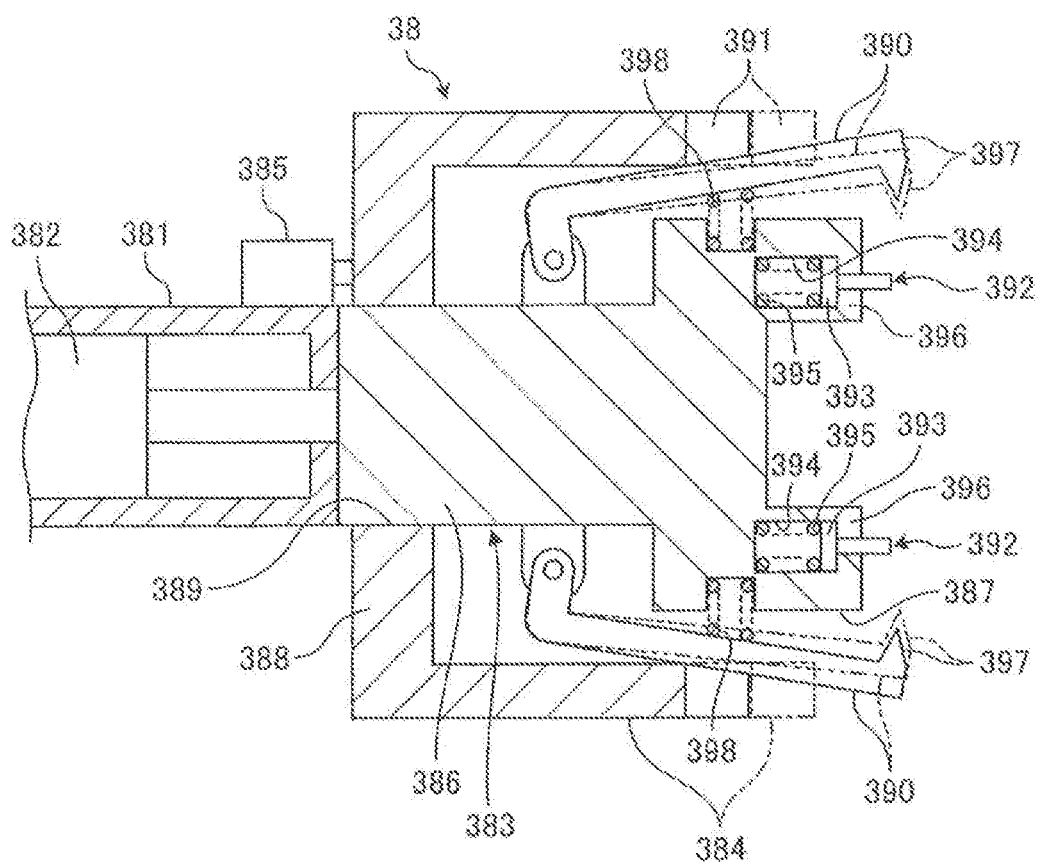
FIG. 26 is a cross-sectional view of a nut holder of the changing apparatus illustrated in FIG. 25.
Figure 27:
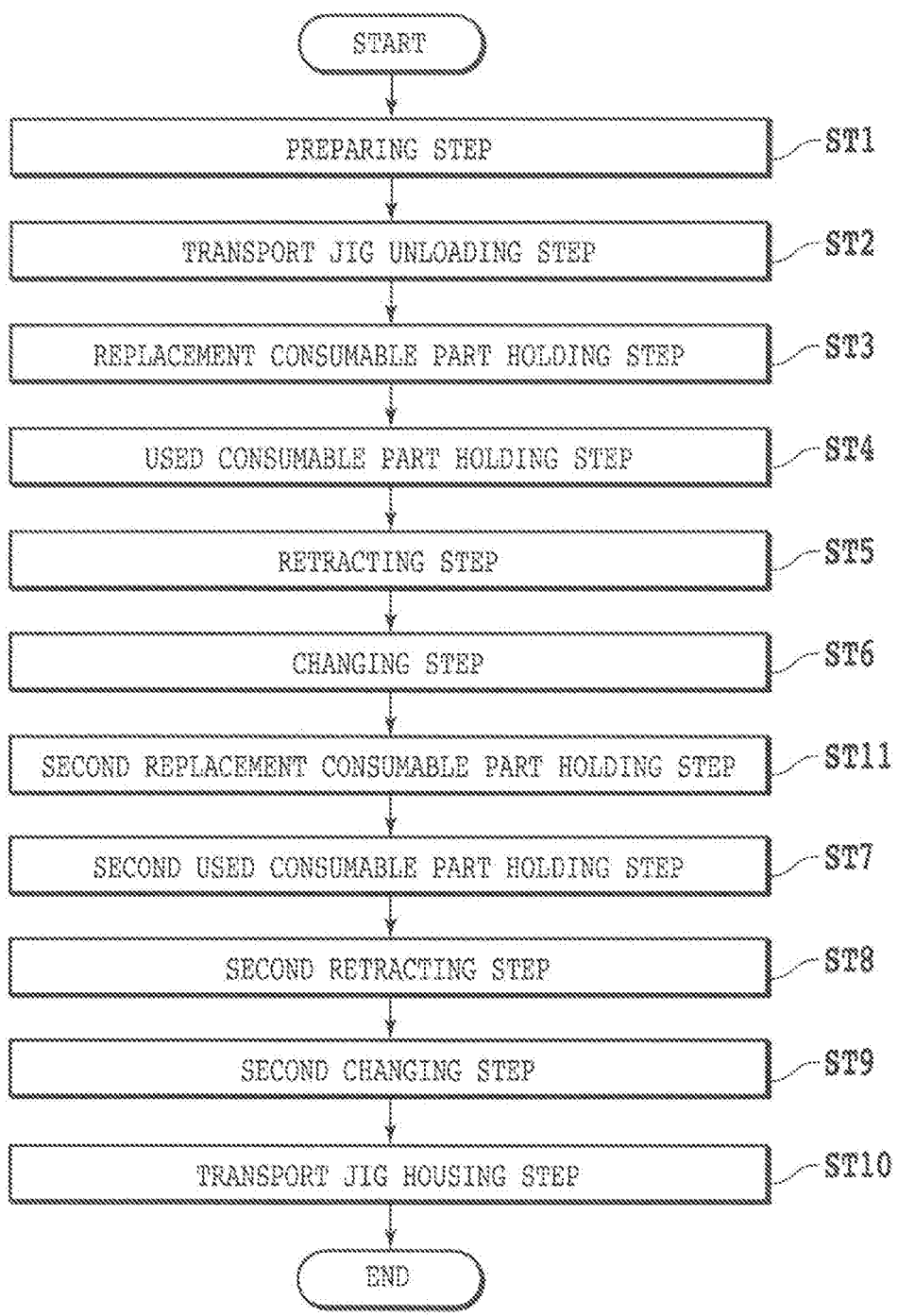
FIG. 27 is a flowchart of the sequence of a changing method according to the second embodiment.

A cutting apparatus and a changing method according to a second embodiment of the present invention will be described below with reference to the drawings. FIG. 24 is an exploded perspective view of a cutting unit of the cutting apparatus according to the second embodiment. FIG. 25 is a front elevational view of a changing apparatus of a blade changing unit of the cutting apparatus illustrated in FIG. 25. FIG. 26 is a cross-sectional view of a nut holder of the changing apparatus illustrated in FIG. 25. FIG. 27 is a flowchart of the sequence of the changing method according to the second embodiment. Those parts illustrated in FIGS. 24, 25, 26, and 27 which are identical to those according to the first embodiment are denoted by identical reference characters, and their description will be omitted hereinbelow.

As illustrated in FIG. 24, a first cutting unit 20-2 of the cutting apparatus, denoted by 1, according to the second embodiment is of the same configuration as the cutting unit 20 of the cutting apparatus 1 according to the first embodiment in that the other end portion 244 of the boss 241 of the mount flange 24 is externally threaded, the first cutting unit 20-2 includes a fastening nut 27 threaded over the externally threaded other end portion 244, and the first cutting unit 20-2 is free of the suction channels 231 and 249.

While the other end portion 244 of the boss 241 of the mount flange 24 extends through the mount hole 214 in the cutting blade 21, the fastening nut 27 is threaded over the externally threaded other end portion 244, securing the cutting blade 21 by sandwiching the cutting blade 21 between itself and the mount flange 24. According to the second embodiment, the cutting blade 21 may be a washer blade having only the cutting edge 213. The fastening nut 27 has four pin fitting holes 271 defined in an end face thereof and spaced at angular intervals of 90 degrees. The fastening nut 27 also has an annular groove 272 defined in and extending fully in an outer circumferential surface thereof.

As illustrated in FIG. 25, a changing unit 32-2 of a changing apparatus 30 of a blade changing unit 3 of the cutting apparatus 1 according to the second embodiment is of the same configuration as the changing unit 32 of the changing apparatus 30 according to the first embodiment except that the changing unit 32-2 is free of the third holder 35 and the fourth holder 36 and includes a nut holder 38 in place of the third holder 35.

The nut holder 38 functions to remove the fastening nut 27 of the cutting unit 20-2 from the boss 241 of the mount flange 24, hold the removed fastening nut 27, and install the fastening nut 27 thus held on the boss 241 of the mount flange 24. The nut holder 38 is mounted on the radially outward extension 324 of the changing unit 32-2.

As illustrated in FIGS. 25 and 26, the nut holder 38 includes a hollow cylindrical electric motor case 381 mounted on the radially outward extension 324 of the changing unit 32-2, an electric motor 382 disposed in the electric motor case 381, a cylindrical rotary member 383 coupled to the drive shaft of the electric motor 382, an actuating ring 384 covering an outer circumference of the rotary member 383, and a second air cylinder 385 interconnecting the electric motor case 381 and the actuating ring 384.

The drive shaft of the electric motor 382 extends perpendicularly to the X-axis directions. When the electric motor 382 rotates the drive shaft about its own central axis, the drive shaft rotates the rotary member 383 about its own central axis. The rotary member 383 is of a cylindrical shape whose outside diameter changes stepwise and integrally includes a small-diameter portion 386 coupled to the drive shaft and a large-diameter portion 387 disposed coaxially with and joined to the small-diameter portion 386, the large-diameter portion 387 being larger in diameter than the small-diameter portion 386. According to the second embodiment, the outside diameter of the small-diameter portion 386 is equal to the outside diameter of the electric motor case 381. According to the second embodiment, the drive shaft, the electric motor case 381, and the rotary member 383 are positioned coaxially with each other.

The actuating ring 384 is in the form of a bottomed tube, i.e., hollow cylinder, having a bottom portion 388 close to the radially outward extension 324 and disposed coaxially with the electric motor case 381 and the rotary member 383. The actuating ring 384 has a through hole 389 defined in the bottom portion 388, and the small-diameter portion 386 of the rotary member 383 extends through the through hole 389. The actuating ring 384 is coupled to the piston rod of the second air cylinder 385. When the piston rod of the second air cylinder 385 extends and contracts, the actuating ring 384 slides in the same axial directions as the rotary member 383 between a position indicated by the solid lines in FIG. 26 and a position indicated by the two-dot-and-dash lines in FIG. 26. The actuating ring 384 has recesses 391 defined in an end thereof remote from the radially outward extension 324 for receiving grip members 390, to be described later, passing therein.

The nut holder 38 has four rotary pins 392 protruding from an end face of the large-diameter portion 387 of the rotary member 383 and spaced at angular intervals of 90 degrees. The rotary pins 392 have respective circular engaging portions 393 on their proximal ends, i.e., left ends in FIG. 26. The engaging portions 393 are slidably disposed in respective cylinder bores 394 defined in the end face of the rotary member 383. Compression springs 395 are disposed between bottom surfaces of the cylinder bores 394 and the engaging portions 393 for normally biasing the rotary pins 392 in a direction to protrude from the end face. The cylinder bores 394 are closed by respective stoppers 396 that engage the engaging portions 393 for preventing the rotary pins 392 from being dislodged. The four rotary pins 392 are disposed in positions where they can fit in the pin fitting holes 271 defined in the fastening nut 27.

The nut holder 38 also has four grip members 390 mounted on an outer circumference of the rotary member 383 and spaced at angular intervals of 90 degrees. The grip members 390 are shaped as arms and have their longitudinal directions extending along the axial directions of the rotary member 383. The grip members 390 have respective grip hooks 397 on their distal ends that project from the end face of the large-diameter portion 387 for engaging in the annular groove 272 defined in the outer circumferential surface of the fastening nut 27. The grip members 390 have respective proximal end portions close to the radially outward extension 324 that are swingably supported on an outer circumferential surface of the small-diameter portion 386 of the rotary member 383. When the grip members 390 are swung about their proximal end portions, the grip hooks 397 are moved toward and away from each other. Compression springs 398 are disposed between an outer circumferential surface of the rotary member 383 and central portions of the grip members 390 for normally biasing the grip members 390 to move the grip hooks 397 radially outwardly.

When the actuating ring 384 is in the position indicated by the solid lines in FIG. 26, the grip hooks 397 thereof are spaced from each other and released out of engagement in the annular groove 272 in the fastening nut 27. When the piston rod of the second air cylinder 385 is extended to move the actuating ring 384 to the position indicated by the two-dot-and-dash lines in FIG. 26, the grip hooks 397 thereof are brought closely to each other and engage in the annular groove 272 in the fastening nut 27.

As illustrated in FIG. 27, the changing method according to the second embodiment includes second replacement consumable part changing step ST11 after changing step ST6 but before second used consumable part holding step ST7. Details of the changing method according to the second embodiment which are different from the changing method according to the first embodiment will be described hereinbelow.

In replacement consumable part holding step ST3 of the changing method according to the second embodiment, as with the first embodiment, the second holder 34 holds under suction a replacement cutting blade 21-1 for one of the cutting units 20.

In used consumable part holding step ST4 of the changing method according to the second embodiment, after the fastening nut 27 of the one cutting unit 20 is removed by the nut holder 38, the rotational shaft 321 is rotated to bring the first holding surface 331 of the first holder 33 into facing relation to the used cutting blade 21-2 mounted on the one cutting unit 20. Then, as with the first embodiment, the first holder 33 holds under suction the used cutting blade 21-2 mounted on the one cutting unit 20.

For removing the fastening nut 27, the cutting apparatus 1 brings the nut holder 38 of the changing unit 32 of the changing apparatus 30 of the blade changing unit 3 into facing relation to the fastening nut 27 by which the used cutting blade 21-2 on the one cutting unit 20 is secured to the mount flange 24, along the Y-axis directions. The cutting apparatus 1 contracts the piston rod of the second air cylinder 385 to move the actuating ring 384 to the position indicated by the solid lines in FIG. 26, and moves the changing unit 32 closely to the one cutting unit 20 along the Y-axis directions until the end face of the rotary member 383 abuts against the fastening nut 27.

The cutting apparatus 1 extends the piston rod of the second air cylinder 385 to move the actuating ring 384 to the position indicated by the two-dot-and-dash lines in FIG. 26, causing the grip hooks 397 of the grip members 390 to engage in the annular groove 272 in the fastening nut 27. The cutting apparatus 1 then energizes the electric motor 382 to rotate the rotary member 383 in a direction to rotate the fastening nut 27 out of engagement with the externally threaded other end portion 244. When the rotary pins 392 are fitted in the pin fitting holes 271, the fastening nut 27 rotates in unison with the rotary member 383.

The cutting apparatus 1 energizes the electric motor 382 to rotate the rotary member 383 for a predetermined period of time. The fastening nut 27 now disengages from the externally threaded other end portion 244 of the boss 241 of the mount flange 24. After having removed the fastening nut 27 from the mount flange 24, the cutting apparatus 1 moves the changing unit 32 away from the one cutting unit 20 along the Y-axis directions. In this manner, the cutting apparatus 1 removes the fastening nut 27 from the one cutting unit 20.

In changing step ST6 of the changing method according to the second embodiment, as with the first embodiment, the cutting apparatus 1 installs the replacement cutting blade 21-1 on the mount flange 24 of the one cutting unit 20, moves the changing unit 32 away from the one cutting unit 20 along the Y-axis directions, positions the changing apparatus 30 in the retracted position, and installs the fastening nut 27 on the mount flange 24 of the one cutting unit 20. In changing step ST6 of the changing method according to the second embodiment, after having installed the fastening nut 27, the cutting apparatus 1 positions the changing unit 32 of the changing apparatus 30 in the retracted position.

For installing the fastening nut 27, the cutting apparatus 1 rotates the rotational shaft 321 to bring the nut holder 38 holding the fastening nut 27 into facing relation to the mount flange 24 of the one cutting unit 20 along the Y-axis directions. The cutting apparatus 1 moves the changing unit 32 of the changing apparatus 30 closely to the mount flange 24 of the one cutting unit 20 along the Y-axis directions and energizes the electric motor 382 to rotate the rotary member 383 in a direction to cause the fastening nut 27 to be threaded over the externally threaded other end portion 244. The cutting apparatus 1 energizes the electric motor 382 to rotate the rotary member 383 for a predetermined period of time. The fastening nut 27 is now threaded over the externally threaded other end portion 244 of the boss 241 of the mount flange 24.

The cutting apparatus 1 actuates the second air cylinder 385 to move the actuating ring 384 to the position indicated by the solid lines in FIG. 26, causing the grip hooks 397 of the grip members 390 to disengage from the annular groove 272 in the fastening nut 27. In this manner, the cutting apparatus 1 installs the fastening nut 27 on the one cutting unit 20.

Second replacement consumable part changing step ST11 is a step of holding a replacement cutting blade 21-1 for the other cutting unit 20 under suction on the second holder 34. In second replacement consumable part changing step ST11, after changing step ST6, the changing unit 32 of the changing apparatus 30 is moved to a position over the transport jig 41 on the table cover 60, and thereafter the replacement cutting blade 21-1 for the other cutting unit 20 is held under suction on the second holder 34 as with replacement consumable part holding step ST3.

In second used consumable part holding step ST7 of the changing method according to the second embodiment, as with used consumable part holding step ST4, after the fastening nut 27 is removed from the other cutting unit 20 by the nut holder 38, the rotational shaft 321 is rotated to bring the first holding surface 331 of the first holder 33 into facing relation to the used cutting blade 21-2 mounted on the other cutting unit 20, and the used cutting blade 21-2 mounted on the other cutting unit 20 is held under suction on the first holder 33.

In second changing step ST9 of the changing method according to the second embodiment, the replacement cutting blade 21-1 is installed on the mount flange 24 of the other cutting unit 20, and the changing unit 32 is moved away from the one cutting unit 20 along the Y-axis directions. After the changing apparatus 30 is positioned in the retracted position, as with the changing step ST6, the fastening nut 27 is installed on the mount flange 24 of the other cutting unit 20. In second changing step ST9 of the changing method according to the second embodiment, after the fastening nut 27 is installed, the changing unit 32 of the changing apparatus 30 is positioned in the retracted position.

In the cutting apparatus 1 according to the second embodiment, since the changing apparatus 30 includes the first holder 33 having the first holding surface 331 and the second holder 34 having the second holding surface 341 and the holding surfaces 331 and 341 can be brought into facing relation to the cutting units 20 by rotating the rotational shaft 321, the cutting apparatus 1 is advantageous in that it has a reduced space for changing the cutting blades 21.

Furthermore, as the changing unit 32 of the changing apparatus 30 of the cutting apparatus 1 according to the second embodiment includes the nut holder 38 for installing and removing the fastening nut 27, the cutting blades 21 can be changed by the blade changing unit 3 even though the cutting blades 21 are secured to the cutting units 20 by the fastening nuts 27.

Figure 28:
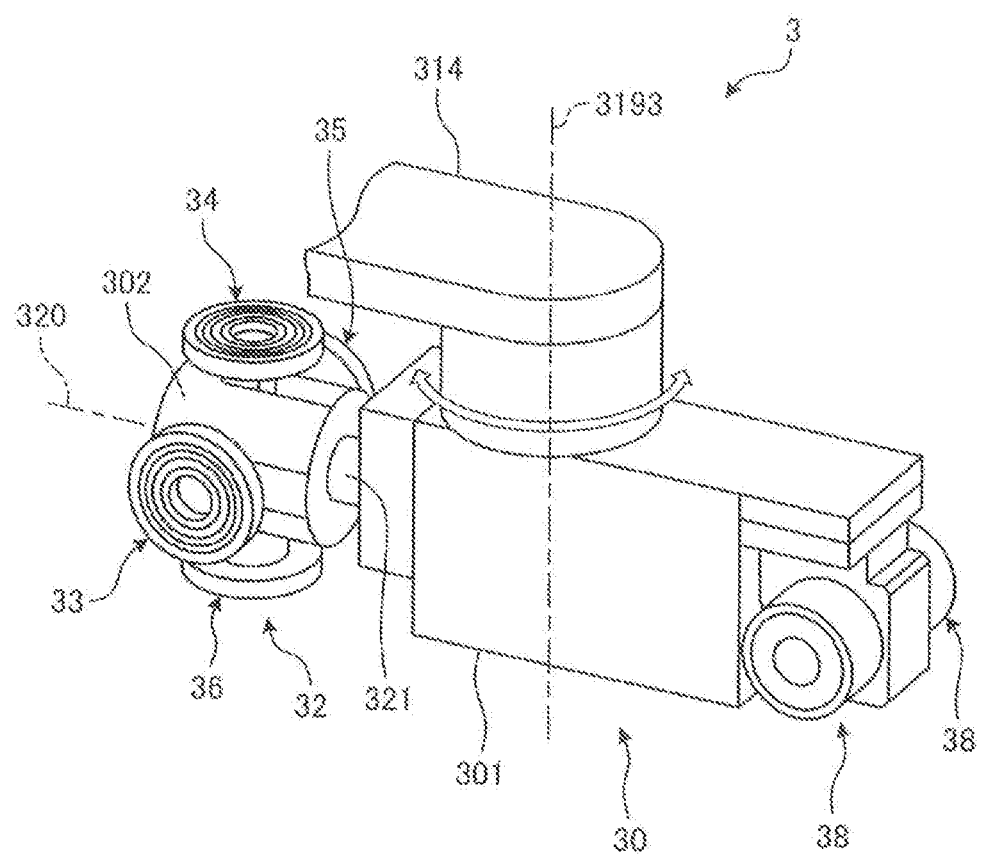
FIG. 28 is a perspective view illustrating a central portion of a blade changing unit of a cutting apparatus according to a modification of the second embodiment.

According to the second embodiment, the blade changing unit 3 is not limited to the above configuration. For example, the nut holder 38 may be arranged as illustrated in FIG. 28. FIG. 28 is a perspective view illustrating a central portion of a blade changing unit of a cutting apparatus according to a modification of the second embodiment. Those parts illustrated in FIG. 28 which are identical to those according to the first and second embodiments are denoted by identical reference characters, and their description will be omitted hereinbelow.

The blade changing unit, denoted by 3 in FIG. 28, includes a pair of opposed nut holders 38 mounted on an apparatus body 301 and disposed in positions where a third rotational axis 3193 is positioned between the nut holder 38 and the changing unit 32. As with the second embodiment, inasmuch as the blade changing unit 3 illustrated in FIG. 28 includes the nut holder 38, the cutting blades 21 can be changed by the blade changing unit 3 even though the cutting blades 21 are secured to the cutting units 20 by the fastening nuts 27.

First Modification

Figure 29:
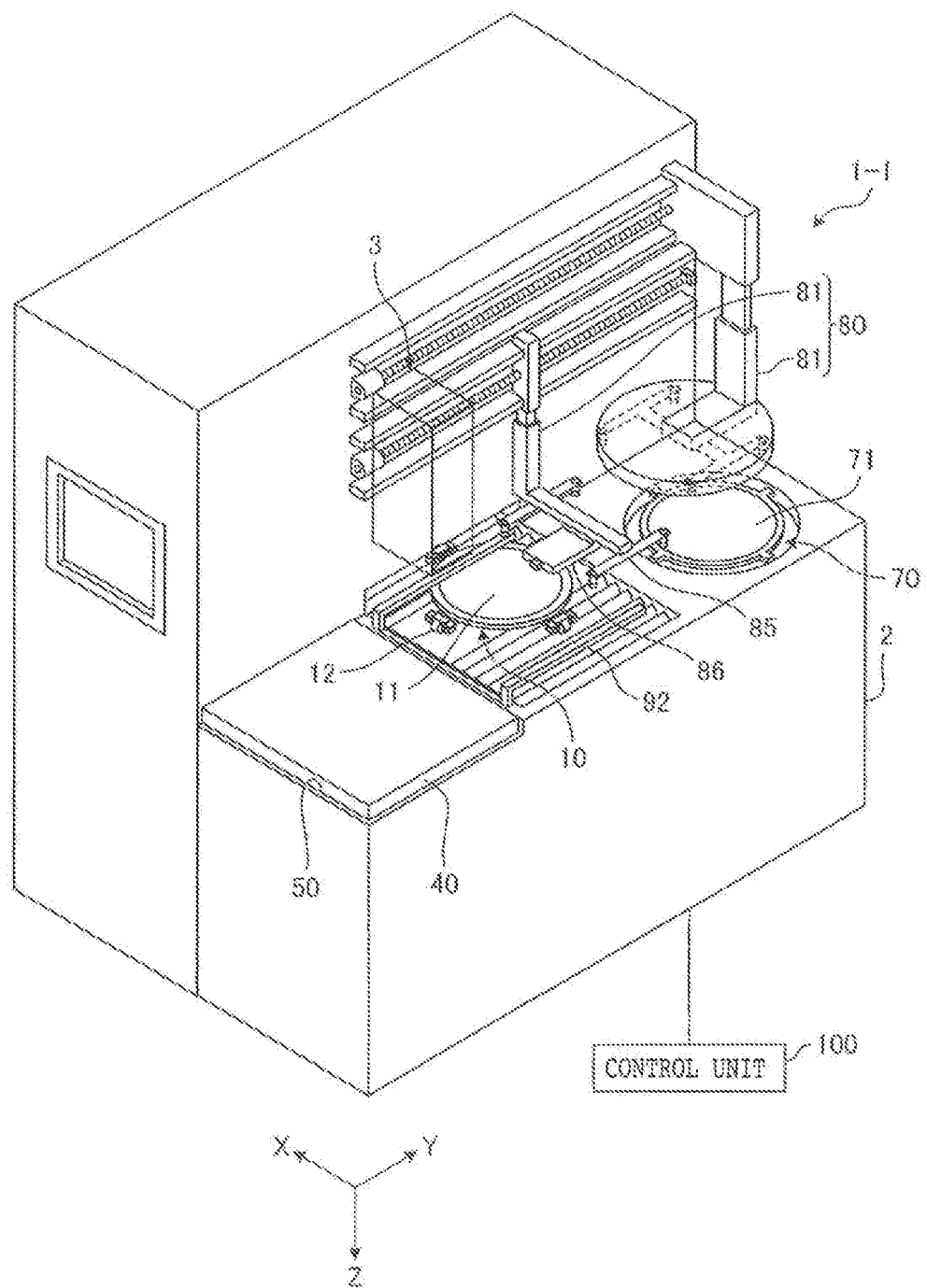
FIG. 29 is a perspective view illustrating a configuration example of a cutting apparatus according to a first modification of the first and second embodiments.
Figure 30:
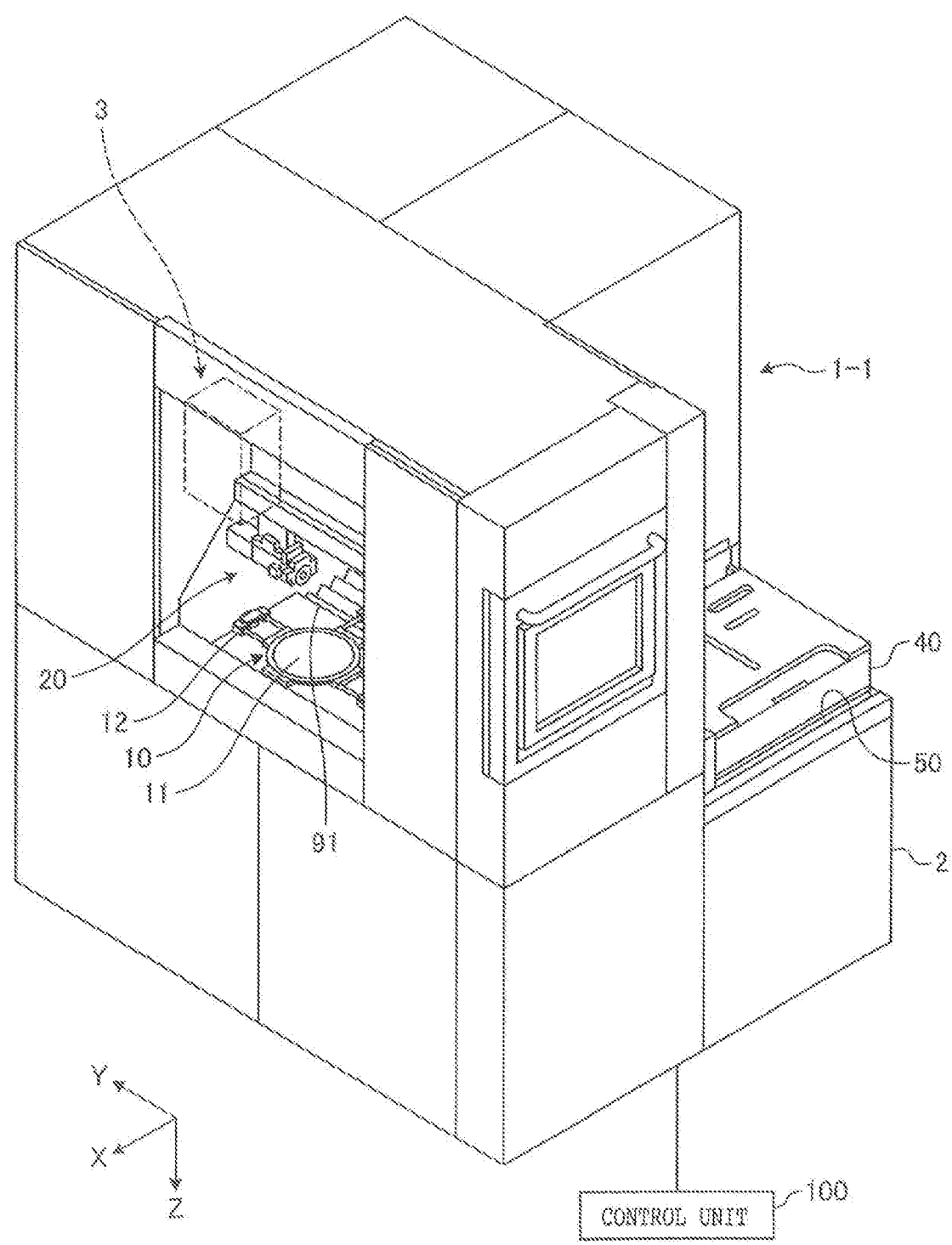
FIG. 30 is a perspective view illustrating another configuration example of the cutting apparatus according to the first modification of the first and second embodiments.

A cutting apparatus 1 according to a first modification of the present invention will be described below with reference to the drawings. FIG. 29 is a perspective view illustrating a configuration example of the cutting apparatus according to the first modification of the first and second embodiments. FIG. 30 is a perspective view illustrating another configuration example of the cutting apparatus according to the first modification of the first and second embodiments. Those parts illustrated in FIGS. 29 and 30 which are identical to those according to the first and second embodiments are denoted by identical reference characters, and their description will be omitted hereinbelow.

A cutting apparatus, denoted by 1-1 in FIGS. 29 and 30, according to the first modification is different from the cutting apparatus according to the first and second embodiments as to the position where the blade changing unit 3 is installed. In the cutting apparatus 1-1 illustrated in FIG. 29, the blade changing unit 3 is disposed in a position above the holding table 10 in the loading/unloading position 92 and in juxtaposed relation to the transport arms 81 along the Y-axis directions. In the cutting apparatus 1-1 illustrated in FIG. 30, the blade changing unit 3 is disposed in juxtaposed relation to the processing chamber 91 along the Y-axis directions. According to the present invention, therefore, the blade changing unit 3 may be changed in position without departing from the scope of the invention.

In the cutting apparatus 1-1 according to the first modification, the changing apparatus 30 includes the first holder 33 having the first holding surface 331 and the second holder 34 having the second holding surface 341. Therefore, the cutting apparatus 1-1 is advantageous in that it has a reduced space for changing the cutting blades 21 as consumable parts, as with the first embodiment.

Second Modification

Figure 31:
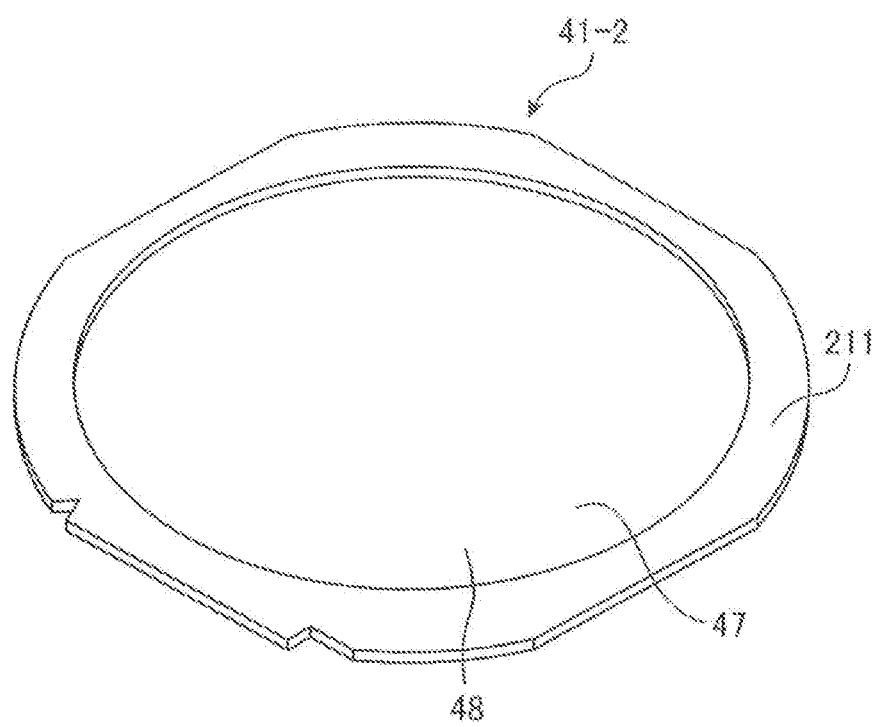
FIG. 31 is a perspective view illustrating a configuration example of a transport jig of a cutting apparatus according to a second modification of the first and second embodiments.

A cutting apparatus 1 according to a second modification of the present invention will be described below with reference to the drawings. FIG. 31 is a perspective view illustrating a configuration example of a transport jig of the cutting apparatus according to the second modification of the first and second embodiments. Those parts illustrated in FIG. 31 which are identical to those according to the first and second embodiments are denoted by identical reference characters, and their description will be omitted hereinbelow.

As illustrated in FIG. 31, a transport jig 41-2 as a consumable part transport jig according to the second modification includes an annular frame 211 and a sheet member 47 stuck to the annular frame 211 in covering relation to the opening of the annular frame 211. The sheet member 47 is in the form of a weakly adhesive tape having a smaller adhesive power than the adhesive tape 210 or a sheet having a tack force. The sheet member 47 has a surface 48 acting as a rest surface on which a cutting blade 21 is to be placed. The annular frame 211 acts as a gripped portion outside of the surface 48 of the sheet member 47.

In the cutting apparatus 1 according to the second modification, the changing apparatus 30 includes the first holder 33 having the first holding surface 331 and the second holder 34 having the second holding surface 341. Therefore, the cutting apparatus 1 is advantageous in that it has a reduced space for changing the cutting blades 21 as consumable parts, as with the first embodiment.

Third Modification

Figure 32:
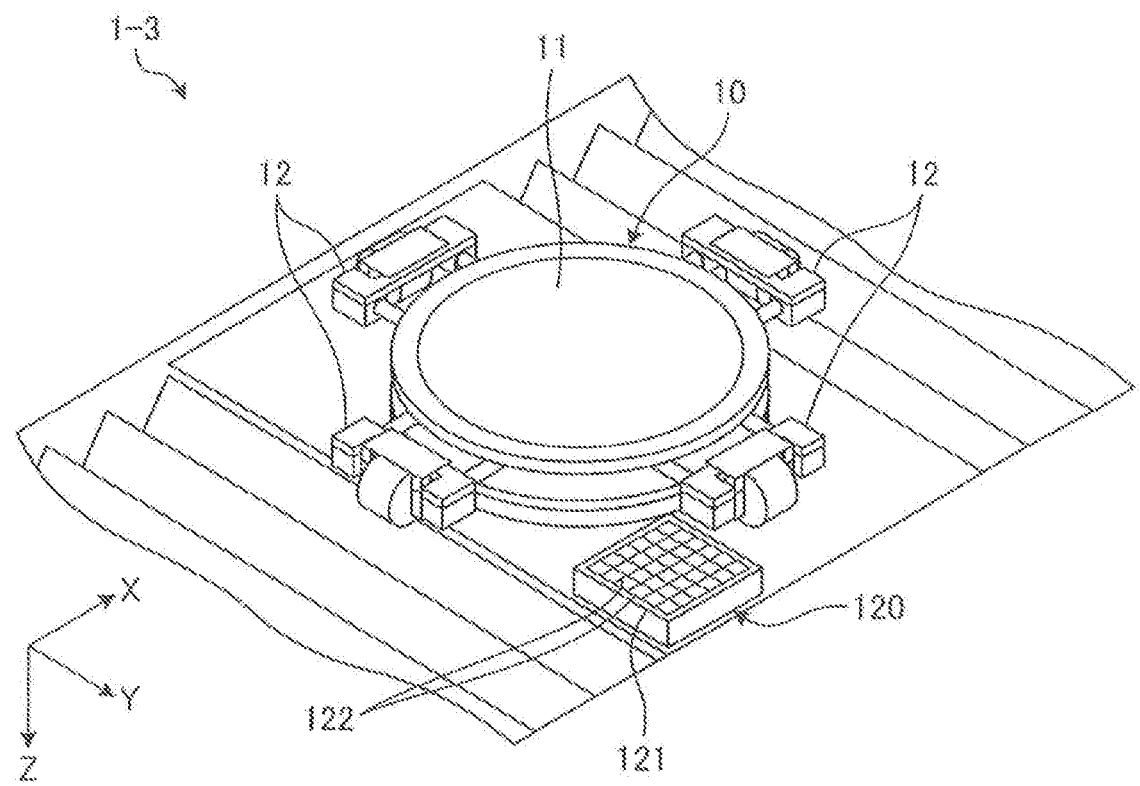
FIG. 32 is a perspective view illustrating a central portion of a configuration example of a cutting apparatus according to a third modification of the first and second embodiments.
Figure 33:
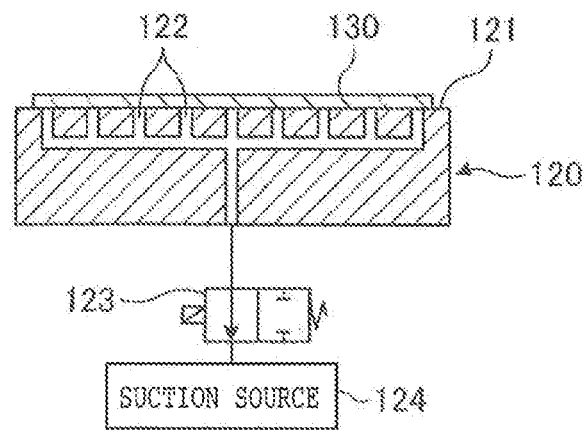
FIG. 33 is a cross-sectional view illustrating a configuration of a dressing board table of the cutting apparatus illustrated in FIG. 32.
Figure 34:
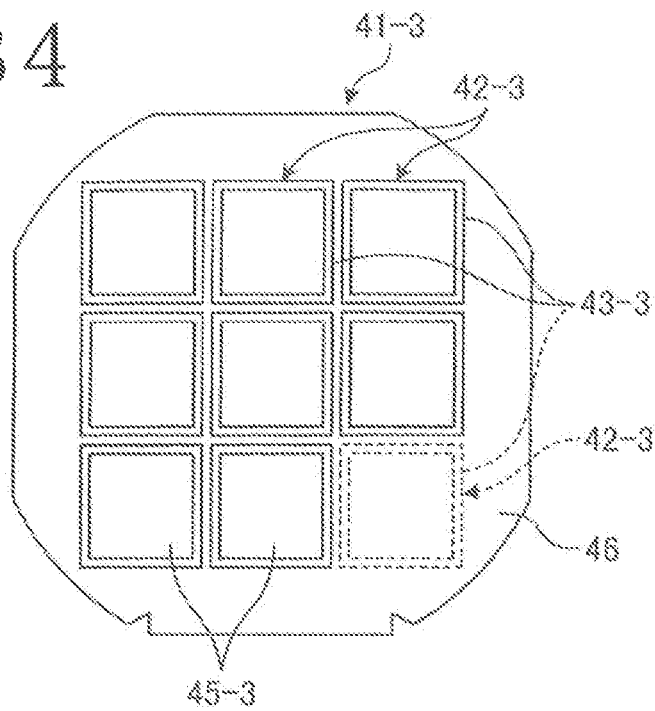
FIG. 34 is a plan view illustrating a configuration example of a transport jig of the cutting apparatus illustrated in FIG. 32.
Figure 35:
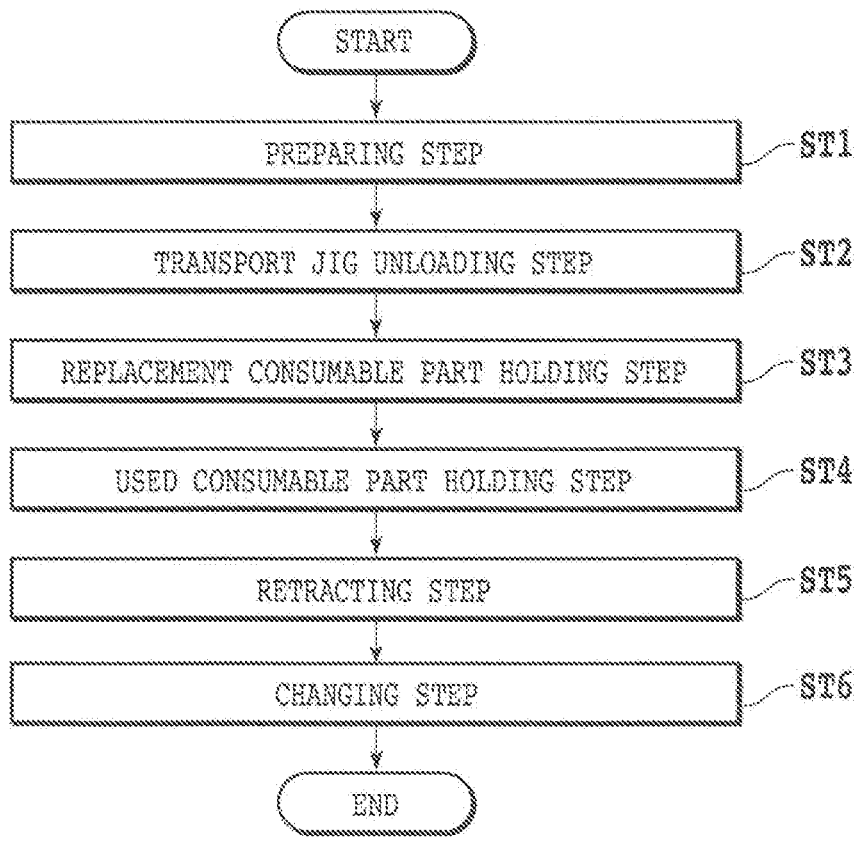
FIG. 35 is a flowchart of the sequence of a changing method according to the third modification of the first and second embodiments.
Figure 36:
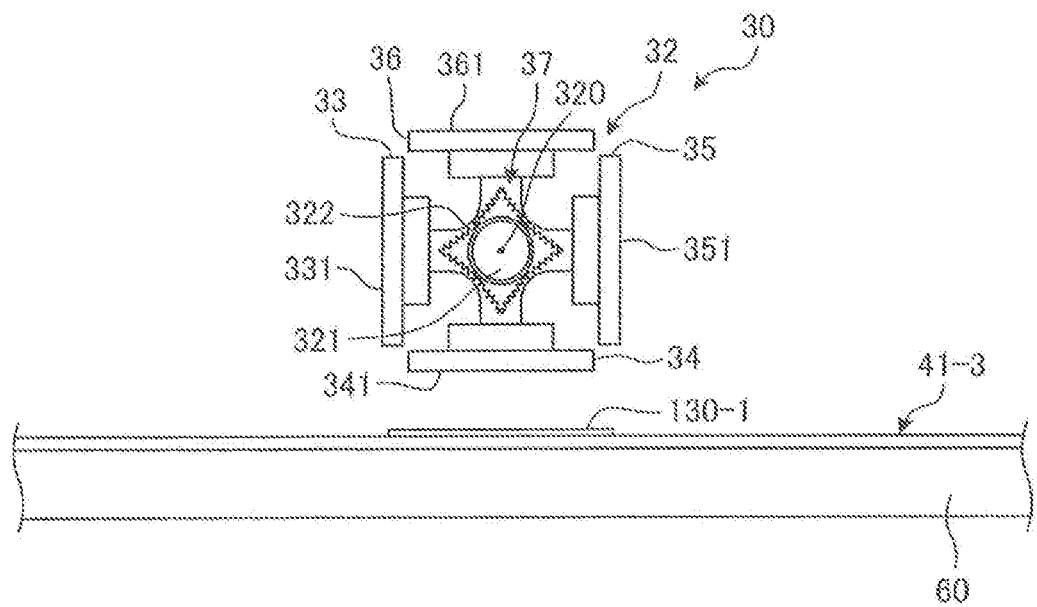
FIG. 36 is a side elevational view illustrating a replacement consumable part holding step of the changing method illustrated in FIG. 35.
Figure 37:
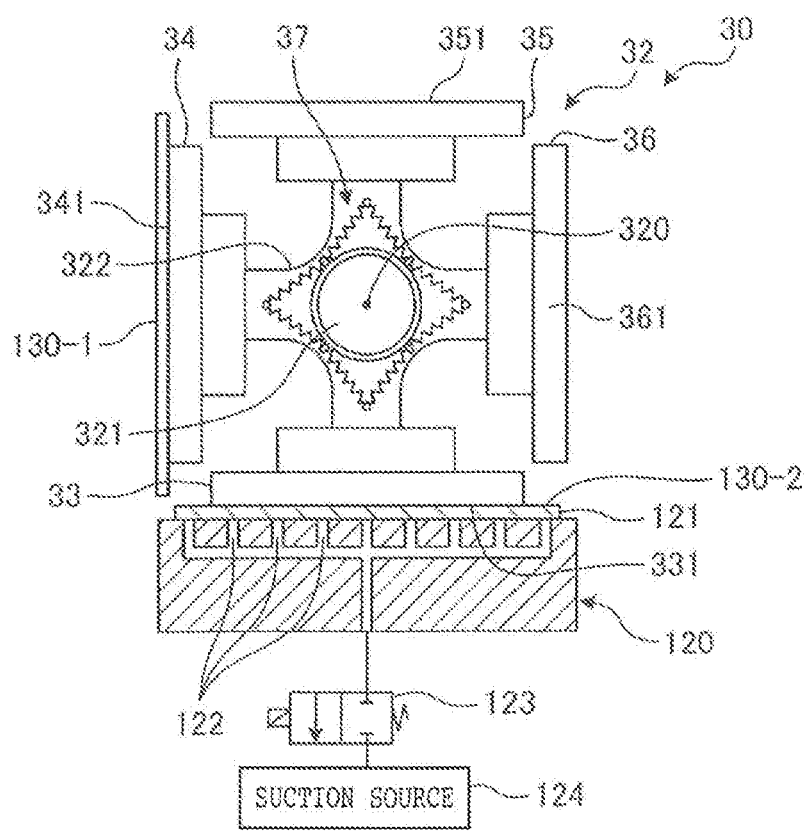
FIG. 37 is a side elevational view illustrating, partly in cross section, a used consumable part holding step of the changing method illustrated in FIG. 35.

A cutting apparatus according to a third modification of the present invention will be described below with reference to the drawings. FIG. 32 is a perspective view illustrating a central portion of a configuration example of the cutting apparatus according to the third modification of the first and second embodiments. FIG. 33 is a cross-sectional view illustrating the configuration of a dressing board table of the cutting apparatus illustrated in FIG. 32. FIG. 34 is a plan view illustrating a configuration example of a transport jig of the cutting apparatus illustrated in FIG. 32. FIG. 35 is a flowchart of the sequence of a changing method according to the third modification of the first and second embodiments. FIG. 36 is a side elevational view illustrating a replacement consumable part holding step of the changing method illustrated in FIG. 35. FIG. 37 is a side elevational view illustrating, partly in cross section, a used consumable part holding step of the changing method illustrated in FIG. 35. Those parts illustrated in FIGS. 32, 33, 34, 35, 36, and 37 which are identical to those according to the first and second embodiments are denoted by identical reference characters, and their description will be omitted hereinbelow.

A cutting apparatus, denoted by 1-3, according to the third modification is of the same configuration as the cutting apparatus according to the first and second embodiments except that the cutting apparatus 1-3 includes a dressing board table 120 as a consumable part holding unit illustrated in FIGS. 32 and 33, and a transport jig 41-3 as a consumable part transport jig illustrated in FIG. 34 holds a dressing board 130 as a consumable part placed thereon.

The dressing board table 120 holds the dressing board 130 thereon, and is disposed adjacent to the holding table 10 and movable in unison with the holding table 10 along the X-axis directions, as illustrated in FIG. 32. The dressing board table 120 is of a rectangular shape and has an upper surface 121 as a holding surface lying at the same height as the holding surface 11 of the holding table 10. As illustrated in FIG. 33, the dressing board table 120 has suction grooves 122 defined therein that are open at the upper surface 121 and connected to a suction source 124 through an on/off valve 123. When the on/off valve 123 is open, the suction grooves 122 are evacuated by the suction source 124, holding the dressing board 130 placed on the upper surface 121 under suction thereon.

The dressing board 130 dresses a cutting blade 21 whose cutting capability has been lowered by clogging or dulling, thereby recovering the cutting capability of the cutting blade 21. The process of dressing a cutting blade 21 to recover the cutting capability of the cutting blade 21 is referred to as dressing.

The dressing board 130 is in the form of a plate whose planar shape is a rectangular shape that is substantially the same as that of the upper surface 121 of the dressing board table 120. The dressing board 130 is made of a bonding material such as resin or ceramics mixed with abrasive grains of alumina-based white alundum (WA), silicon-carbide-based green carbonite (GC), or diamond.

The transport jig 41-3 illustrated in FIG. 34 according to the third modification has a plurality of board rests 42-3 for holding respective dressing boards 130 positioned and placed thereon. Each of the board rests 42-3 has an upstanding tube 43-3 having an inner circumferential surface whose planar shape is equal to the planar shape of a dressing board 130. The upstanding tube 43-3 houses a dressing board 130 therein. Each of the board rests 42-3 has a bottom surface 45-3 as a rest surface. The transport jig 41-3 includes an outer edge portion 46 extending outside of the board rests 42-3 and acting as a held portion to be held by the transport unit 80. According to the third modification, as with the first embodiment, the board rests 42-3 are grouped in advance into board rests 42-3 for placing replacement dressing boards 130 as replacement consumable parts thereon and board rests 42-3 for placing used dressing boards 130 as used consumable parts thereon. In FIG. 34, the board rests 42-3 for placing replacement dressing boards 130 thereon are indicated by the solid lines, whereas the board rest 42-3 for placing a used dressing board 130 thereon is indicated by the dotted lines.

The transport jig 41-3 according to the third embodiment with the dressing boards 130 placed on the respective board rests 42-3 can be housed in the consumable part housing container 40 and can be transported by the transport unit 80 in the same manner as the annular frame 211.

In the cutting apparatus 1-3, partly illustrated in FIG. 32, the changing unit 32 changes the dressing board 130 on the dressing board table 120. The changing unit 32 includes the holders 33, 34, 35, and 36 that hold dressing boards 130 under suction.

A changing method according to the third modification includes, as illustrated in FIG. 35, preparing step ST1, transport jig unloading step ST2, replacement consumable part holding step ST3, used consumable part holding step ST4, retracting step ST5, and changing step ST6. Details of the changing method according to the third modification which are different from the changing method according to the first embodiment will be described hereinbelow.

In replacement consumable part holding step ST3 according to the third modification, as illustrated in FIG. 36, the cutting apparatus 1-3 positions the second holding surface 341 of the second holder 34 of the changing unit 32 of the changing apparatus 30 above a replacement dressing board 130 (hereinafter denoted by 130-1) placed on a board rest 42-3 of the transport jig 41-3 on the table cover 60. In replacement consumable part holding step ST3 according to the third modification, the cutting apparatus 1-3 lowers the changing unit 32 until the second holding surface 341 of the second holder 34 is held in intimate contact with the replacement dressing board 130-1, thereafter holds the replacement dressing board 130-1 under suction on the second holding surface 341, and then lifts the changing unit 32.

In used consumable part holding step ST4 according to the third modification, the cutting apparatus 1-3 positions the first holding surface 331 of the first holder 33 of the changing unit 32 of the changing apparatus 30 above a used dressing board 130 (hereinafter denoted by 130-2) on the dressing board table 120. In used consumable part holding step ST4 according to the third modification, the cutting apparatus 1-3 lowers the changing unit 32 until the first holding surface 331 of the first holder 33 is held in intimate contact with the used dressing board 130-2, thereafter holds the used dressing board 130-2 under suction on the first holding surface 331, and then closes the on/off valve 123 to stop holding the used dressing board 130-2 under suction on the dressing board table 120, as illustrated in FIG. 37. In used consumable part holding step ST4, therefore, the cutting apparatus 1-3 positions the changing apparatus 30 in the changing position in which the first holding surface 331 of the first holder 33 is held in intimate contact with the used dressing board 130-2 on the dressing board table 120.

In retracting step ST5 according to the third modification, the cutting apparatus 1-3 lifts the changing unit 32 away from the dressing board table 120 and positions the changing apparatus 30 in the retracted position in which the used dressing board 130-2 is spaced a distance from the upper surface 121 of the dressing board table 120.

In changing step ST6 according to the third modification, the cutting apparatus 1-3 rotates the rotational shaft 321 of the changing unit 32 of the changing apparatus 30 to bring the second holding surface 341 of the second holder 34 that has held the replacement dressing board 130-1 above the upper surface 121 of the dressing board table 120. In changing step ST6 according to the third modification, the cutting apparatus 1-3 lowers the changing unit 32 of the changing apparatus 30 to position the changing apparatus 30 in the changing position in which the replacement dressing board 130-1 held under suction on the second holding surface 341 of the second holder 34 is placed on the upper surface 121 of the dressing board table 120.

In changing step ST6 according to the third modification, the cutting apparatus 1-3 opens the on/off valve 123 to hold the replacement dressing board 130-1 held under suction on the upper surface 121 of the dressing board table 120 and stops holding the replacement dressing board 130-1 under suction on the second holding surface 341 of the second holder 34 of the changing unit 32. In changing step ST6 according to the third modification, the cutting apparatus 1-3 moves the changing unit 32 of the changing apparatus 30 away from the dressing board table 120 as by lifting the changing unit 32, whereupon the changing method according to the third modification comes to an end.

In the cutting apparatus 1-3 according to the third modification, the changing apparatus 30 includes the first holder 33 having the first holding surface 331 and the second holder 34 having the second holding surface 341. Therefore, the cutting apparatus 1-3 is advantageous in that it has a reduced space for changing the dressing boards 130 as consumable parts, as with the first embodiment.

In the cutting apparatus 1-3 according to the third modification, the line scanner 110 may capture an image of a dressing board 130 while the dressing board 130 is being transported in transport jig unloading step ST2, read a bar code or an identification mark, not illustrated, on the surface of the dressing board 130, detect the kind of the dressing board 130, and place a dressing board 130 depending on the cutting blade 21 to be dressed on the dressing board table 120.

The present invention is not limited to the above embodiments and modifications. In other words, various changes and modifications may be made without departing from the scope of the invention. According to the first embodiment, etc., the transport jigs 41 and 41-2 with the cutting blades 21 placed thereon are illustrated, and according to the third modification, the transport jig 41-3 with the dressing boards 130 placed thereon is illustrated. However, according to the present invention, both the transport jigs 41 and 41-2 with the cutting blades 21 placed thereon and the transport jig 41-3 with the dressing boards 130 placed thereon may be housed in the consumable part housing container 40.

Furthermore, according to the present invention, the transport jigs 41, 41-2, and 41-3 may be housed in the predetermined slots 52 in the cassette 51, or may be housed in a cassette, not illustrated, separate from the cassette 51 that houses workpieces 200. According to the present invention, moreover, an image capturing unit for alignment may be used as an image capturing unit for capturing an image of cutting blades 21 or dressing boards 130 as consumable parts placed on the transport jig 41. According to the present invention, in addition, the centering guides 82 or the holding table 10, other than the table cover 60, may be used as a temporary rest, or a dedicated temporary table may be provided. According to the present invention, furthermore, the cutting apparatus 1, 1-1, or 1-3 may not use the transport jigs 41 and 41-2, but may include a known blade stocker for holding a plurality of cutting blades 21, and the changing apparatus 30 may transfer cutting blades 21 to and from the blade stocker. Moreover, according to the present invention, consumable parts are not limited to cutting blades 21 and dressing boards 130.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A cutting apparatus comprising:
    a consumable part holding unit having a holding surface for holding a consumable part;
    a changing apparatus for changing the consumable part; and
    a moving unit for moving the changing apparatus between a changing position for changing the consumable part and a retracted position, wherein
    the changing apparatus includes
        a rotational shaft having a rotational axis associated therewith,
        a first holder in the form of circular plate for holding a used consumable part, the first holder having a first holding surface facing in an outward direction from the rotational shaft and the first holding surface being oriented perpendicularly to a radially outward extending line extending from the rotational axis of the rotational shaft to the first holding surface, the used consumable part facing the first holding surface when the first holder holds the used consumable part, and
        a second holder in the form of circular plate for holding a replacement consumable part, the second holder being disposed in a position angularly spaced a predetermined angle from the first holder around the rotational shaft, the second holder having a second holding surface facing in an outward direction from the rotational shaft and the second holding surface being oriented perpendicularly to a radially outward extending line extending from the rotational axis of the rotational shaft to the second holding surface, the replacement consumable part facing the second holding surface when the second holder holds the replacement consumable part.

2. The cutting apparatus according to claim 1, wherein the changing apparatus further includes
    a third holder in the form of circular plate, the third holder having a third holding surface facing in an outward direction from the rotational shaft and the third holding surface being oriented perpendicularly to a radially outward extending line extending from the rotational axis of the rotational shaft to the third holding surface, and
    a fourth holder in the form of circular plate, the fourth holder having a fourth holding surface facing in an outward direction from the rotational shaft and the fourth holding surface being oriented perpendicularly to a radially outward extending line extending from the rotational axis of the rotational shaft to the fourth holding surface, and
    the first holder, the second holder, the third holder, and the fourth holder are disposed in respective positions spaced at angular intervals of 90 degrees around the rotational shaft.

3. The cutting apparatus according to claim 1, wherein the first holding surface of the first holder is tiltably coupled to the rotational shaft by a joint assembly having a resilient member, and the second holding surface of the second holder is tiltably coupled to the rotational shaft by a joint assembly having a resilient member.

4. The cutting apparatus according to claim 1, further comprising:
    a processing chamber for cutting a workpiece with a cutting unit therein, wherein
    the changing apparatus is disposed outside of the processing chamber, and
    the processing chamber has an exit/entrance port defined therein for allowing the changing apparatus to move therethrough into and out of the processing chamber.

5. The cutting apparatus according to claim 1, further comprising:
    a consumable part housing container for housing a consumable part transport jig therein, the consumable part transport jig having a plurality of rest surfaces for holding a plurality of consumable parts placed thereon and a held portion outside of the rest surfaces, the held portion is to be held by a transport unit;
    a temporary rest for temporarily placing the consumable part transport jig thereon upon changing consumable parts;
    the transport unit for transporting the consumable part transport jig from the consumable part housing container to the temporary rest; and
    an image capturing unit for capturing an image of consumable parts placed on the consumable part transport jig, the image capturing unit being disposed in a transport route along which the transport unit transports consumable part transport jig.

6. The cutting apparatus according to claim 1, further comprising:
    a cutting unit having a spindle and a cutting blade mounted on a distal end of the spindle by a mount flange, wherein
    the consumable part includes the cutting blade and the consumable part holding unit includes the mount flange.

7. The cutting apparatus according to claim 1, further comprising:
    a holding table for holding a workpiece; and
    a dressing board table for holding a dressing board for dressing a cutting blade, the dressing board table being disposed adjacent to the holding table, wherein
    the consumable part includes the dressing board and the consumable part holding unit includes the dressing board table.

8. The cutting apparatus according to claim 1,
    wherein the first holding surface is parallel to a plane that is perpendicular to a radially outward extending line extending from the rotational axis of the rotational shaft to the first holding surface and
    wherein the second holding surface is parallel to a plane that is perpendicular to a radially outward extending line extending from the rotational axis of the rotational shaft to the second holding surface.

9. The cutting apparatus according to claim 8, wherein the changing apparatus further comprises a support member, the support member defining a through hole, wherein the support member is positioned about the rotational shaft whereby the rotational shaft extends through the through hole of the support member,
    a support member comprising a plurality of radially outward extensions extending radially outwardly relative to the rotational axis of the rotational shaft, each extension having a radially distal end, wherein the first holder is coupled to the radially distal end of a first one of the plurality of extensions, wherein the second holder is coupled to the radially distal end of a second one of the plurality of extensions.

10. The cutting apparatus according to claim 1, wherein the first holder is configured to hold the used consumable part via suction and wherein the second holder is configured to hold the replacement consumable part via suction.

11. A changing method for changing consumable parts in a cutting apparatus, the cutting apparatus including
- a consumable part holding unit having a holding surface for holding a consumable part,
- a changing apparatus for changing the consumable part, and
- a moving unit for moving the changing apparatus between a changing position for changing the consumable part and a retracted position, the changing apparatus including
- a rotational shaft,
- a first holder for holding a used consumable part, the first holder having a first holding surface facing in an outward direction from the rotational shaft perpendicularly to the rotational shaft, and
- a second holder for holding a replacement consumable part, the second holder being disposed in a position angularly spaced a predetermined angle from the first holder around the rotational shaft, the second holder having a second holding surface facing in an outward direction from the rotational shaft perpendicularly to the rotational shaft, the changing method comprising the steps of:

transferring a replacement consumable part residing on a rest surface of a consumable part transport jig to the second holder, wherein the consumable part transport jig has a plurality of rest surfaces for holding a plurality of consumable parts thereon;

after transferring the replacement consumable part to the second holder, rotating the rotational shaft of the changing apparatus to bring the first holding surface of the first holder into facing relation to a used consumable part being held by the consumable part holding unit, positioning the first holder in a changing position for abutting against the used consumable part, and transferring the used consumable part from the consumable part holding unit to the first holder of the changing apparatus;

retracting the first holder that has held the used consumable part from the changing position to a retracted position; and after transferring the replacement consumable part to the second holder and after transferring the used consumable part from the consumable part holding unit to the first holder, rotating the rotational shaft to bring the second holding surface of the second holder that holds the replacement consumable part into facing relation to the holding surface of the consumable part holding unit, positioning the second holder in the changing position, and transferring the replacement consumable part from the second holder to the consumable part holding unit.

12. The changing method according to claim 11, wherein the consumable part includes a cutting blade and the consumable part holding unit includes a mount flange.

13. The changing method according to claim 11, wherein the consumable part includes a dressing board for dressing a cutting blade and the consumable part holding unit includes a dressing board table.

14. A cutting apparatus comprising:

a consumable part holding unit having a holding surface for holding a consumable part;

a changing apparatus for changing the consumable part; and a moving unit for moving the changing apparatus between a changing position for changing the consumable part and a retracted position, wherein the changing apparatus includes
- a rotational shaft,
- a first holder for holding a used consumable part, the first holder having a first holding surface facing in an outward direction from the rotational shaft perpendicularly to the rotational shaft, wherein the first holding surface of the first holder is tiltably coupled to the rotational shaft by a joint assembly having a resilient member, and
- a second holder for holding a replacement consumable part, the second holder being disposed in a position angularly spaced a predetermined angle from the first holder around the rotational shaft, the second holder having a second holding surface facing in an outward direction from the rotational shaft perpendicularly to the rotational shaft, wherein the second holding surface of the second holder is tiltably coupled to the rotational shaft by a joint assembly having a resilient member.

* * * * *